(12) United States Patent
Shih et al.

(10) Patent No.: US 11,600,595 B2
(45) Date of Patent: Mar. 7, 2023

(54) SEMICONDUCTOR PACKAGE AND MANUFACTURING METHOD THEREOF

(71) Applicant: Taiwan Semiconductor Manufacturing Co., Ltd., Hsinchu (TW)

(72) Inventors: Ying-Ching Shih, Hsinchu (TW); Chih-Wei Wu, Yilan County (TW); Szu-Wei Lu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 253 days.

(21) Appl. No.: 16/936,433

(22) Filed: Jul. 23, 2020

(65) Prior Publication Data

US 2020/0357768 A1 Nov. 12, 2020

Related U.S. Application Data

(63) Continuation of application No. 16/116,892, filed on Aug. 29, 2018, now Pat. No. 10,756,058.

(51) Int. Cl.
*H01L 23/498* (2006.01)
*H01L 25/065* (2023.01)
(Continued)

(52) U.S. Cl.
CPC ........ *H01L 25/0655* (2013.01); *H01L 21/568* (2013.01); *H01L 23/3128* (2013.01); *H01L 23/49822* (2013.01); *H01L 23/49838* (2013.01); *H01L 23/5381* (2013.01); *H01L 24/09* (2013.01); *H01L 24/16* (2013.01);
(Continued)

(58) Field of Classification Search
CPC .......... H01L 2224/16145; H01L 25/50; H01L 25/0655; H01L 2224/0401–05013; H01L 23/5384
See application file for complete search history.

(56) References Cited

U.S. PATENT DOCUMENTS 9,000,584 B2   4/2015 Lin et al.
9,048,222 B2   6/2015 Hung et al.
(Continued)

*Primary Examiner* — Hoa B Trinh
(74) *Attorney, Agent, or Firm* — JCIPRNET

(57) ABSTRACT

A semiconductor package includes semiconductor bridge, first and second multilayered structures, first encapsulant, and a pair of semiconductor dies. Semiconductor dies of the pair include semiconductor substrate and conductive pads disposed at front surface of semiconductor substrate. Semiconductor bridge electrically interconnects the pair of semiconductor dies. First multilayered structure is disposed on rear surface of one semiconductor die. Second multilayered structure is disposed on rear surface of the other semiconductor die. First encapsulant laterally wraps first multilayered structure, second multilayered structure and the pair of semiconductor dies. Each one of first multilayered structure and second multilayered structure includes a top metal layer, a bottom metal layer, and an intermetallic layer. Each one of first multilayered structure and second multilayered structure has surface coplanar with surface of first encapsulant. The top metal layers, the bottom metal layers, and the intermetallic layers are in contact with the first encapsulant.

20 Claims, 30 Drawing Sheets

(51) Int. Cl.
*H01L 23/31* (2006.01)
*H01L 23/538* (2006.01)
*H01L 23/00* (2006.01)
*H01L 25/00* (2006.01)
*H01L 21/56* (2006.01)

(52) U.S. Cl.
CPC ...... *H01L 25/50* (2013.01); *H01L 2224/0401* (2013.01); *H01L 2224/16145* (2013.01)

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2016/0071818 A1* | 3/2016 | Wang .................... H01L 23/367 257/773 |
| 2018/0102311 A1* | 4/2018 | Shih .................. H01L 23/49827 |
| 2019/0051633 A1* | 2/2019 | Bhagavat ............ H01L 23/5385 |
| 2019/0096851 A1* | 3/2019 | Liao ...................... H01L 21/563 |
| 2020/0006232 A1* | 1/2020 | Pietambaram .......... H01L 24/97 |
| 2020/0058627 A1* | 2/2020 | Chen .................. H01L 23/3135 |
| 2021/0280519 A1* | 9/2021 | Chang ................ H01L 23/5389 |

* cited by examiner

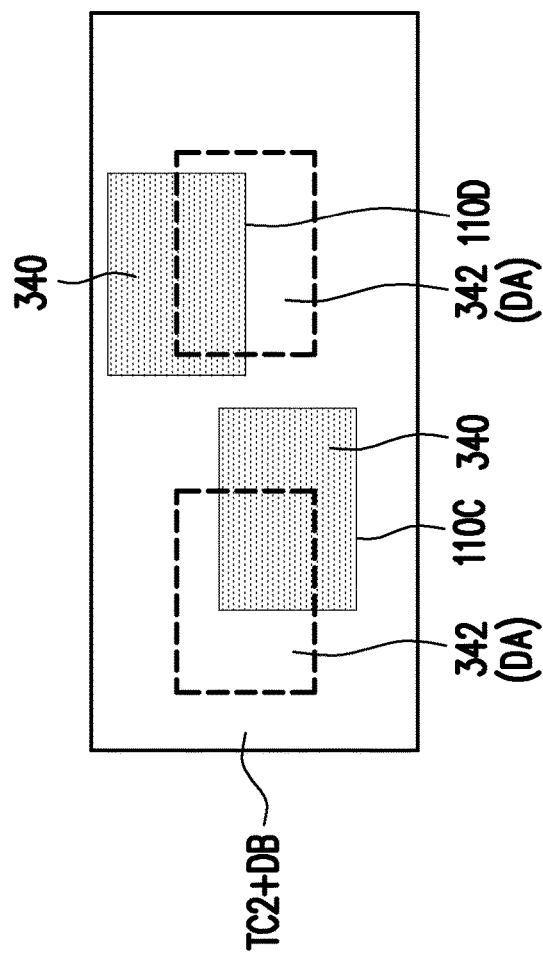
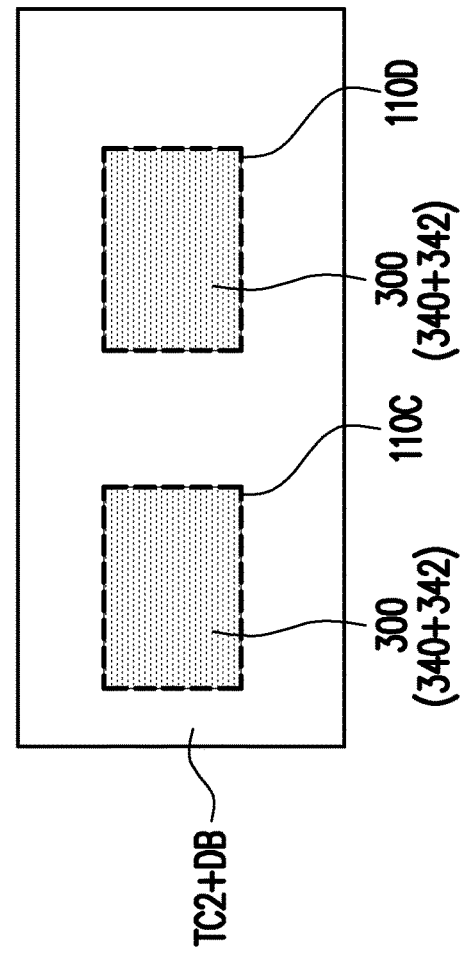
FIG. 2A
FIG. 2B

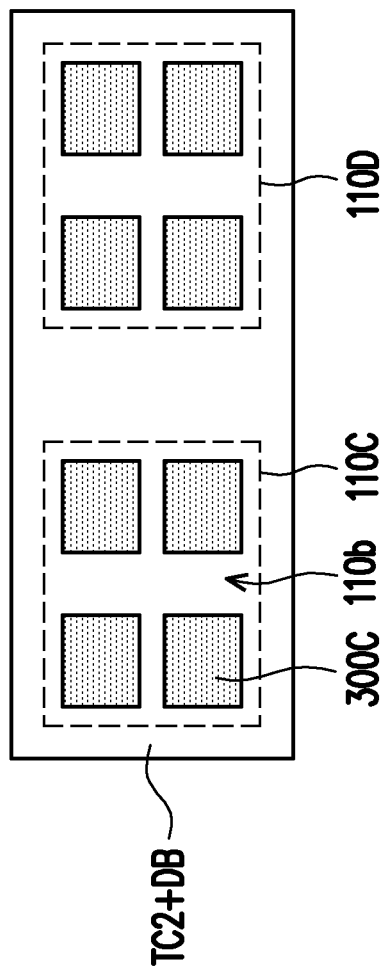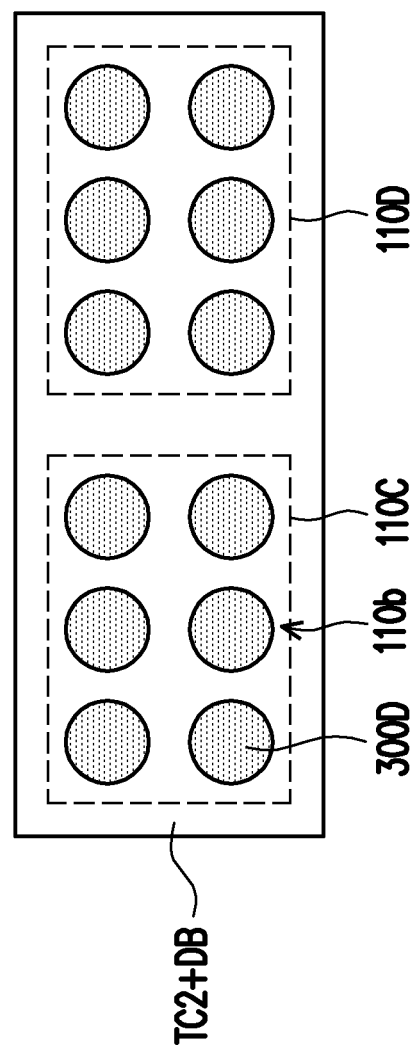

SEMICONDUCTOR PACKAGE AND MANUFACTURING METHOD THEREOF

CROSS-REFERENCE

This application is a continuation application of and claims the priority benefit of U.S. patent application Ser. No. 16/116,892, filed on Aug. 29, 2018, now allowed. The entirety of the above-mentioned patent application is hereby incorporated by reference herein and made a part of this specification.

BACKGROUND

Semiconductor devices and integrated circuits used in a variety of electronic applications, such as cell phones and other mobile electronic equipment, are typically manufactured from a single semiconductor wafer. The dies of the wafer may be processed and packaged with other semiconductor devices or dies at the wafer level, and various technologies have been developed for wafer level packaging. In addition, for multi-die packages, the arrangement of the dies and the corresponding connecting elements affects data transmission speed among semiconductor dies and reliability of the packaged products.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 2A through FIG. 2D are schematic bottom views of structures produced at various stages of a manufacturing method of a semiconductor package according to some embodiments of the present disclosure.

DESCRIPTION OF THE EMBODIMENTS

Figure 1A:
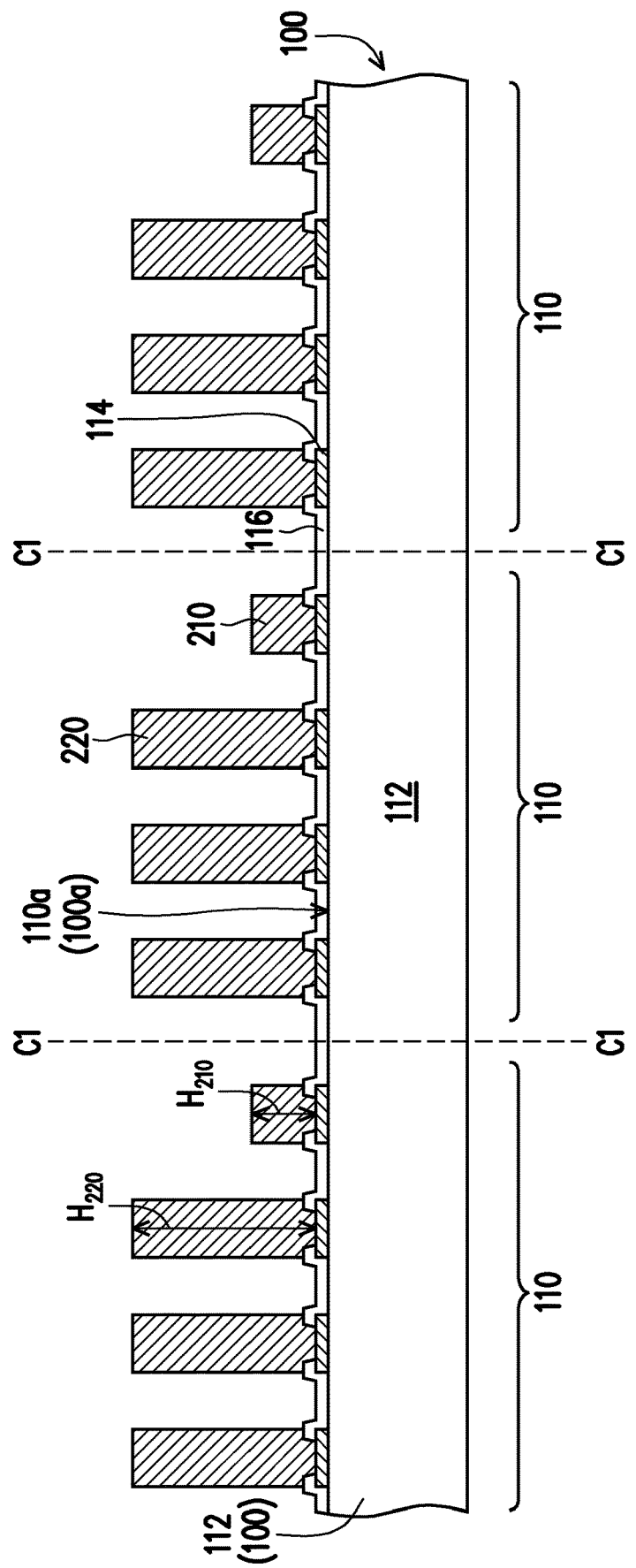
FIG. 1A through FIG. 1Q show schematic cross-sectional views of structures produced at various stages of a manufacturing method of a semiconductor package according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments of the present disclosure describe the exemplary manufacturing process of package structures and the package structures fabricated there-from. Certain embodiments of the present disclosure are related to the package structures formed with aligning structures and bridging structures connecting dies. The wafers or dies may include one or more types of integrated circuits or electrical components on a bulk semiconductor substrate or a silicon/germanium-on-insulator substrate. The embodiments are intended to provide further explanations but are not to be used to limit the scope of the present disclosure.

Figure 1B:
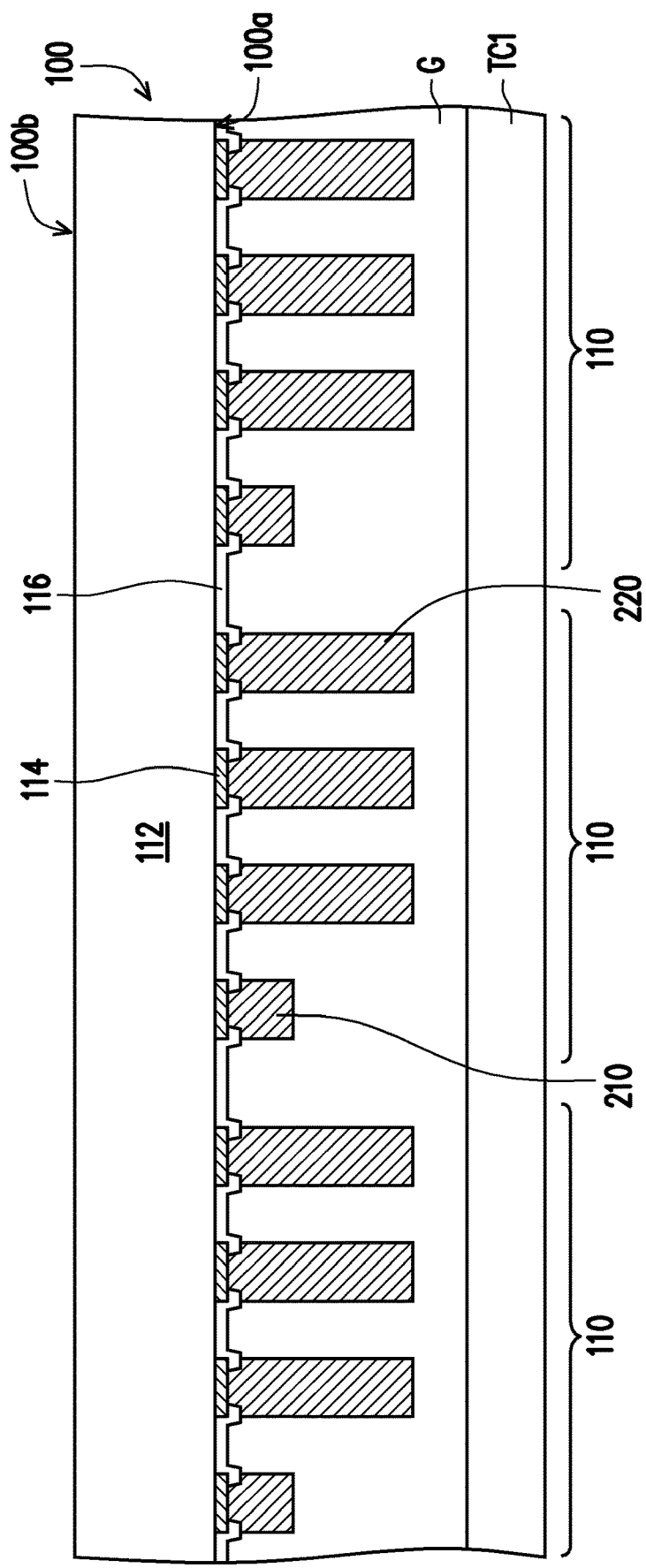
FIG. 1R shows a schematic cross-sectional view of a semiconductor package connected to a circuit substrate according to some embodiments of the present disclosure.
Figure 1C:
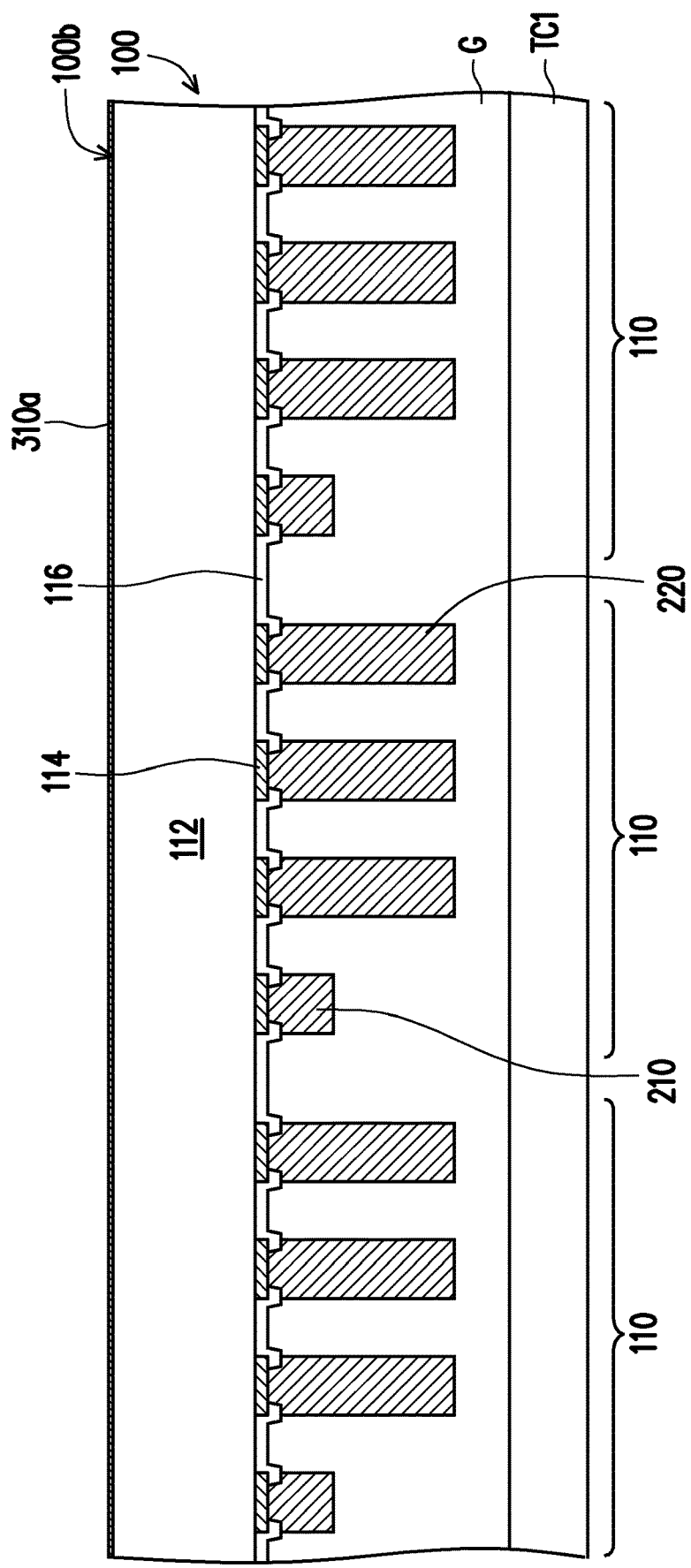
Figure 1D:
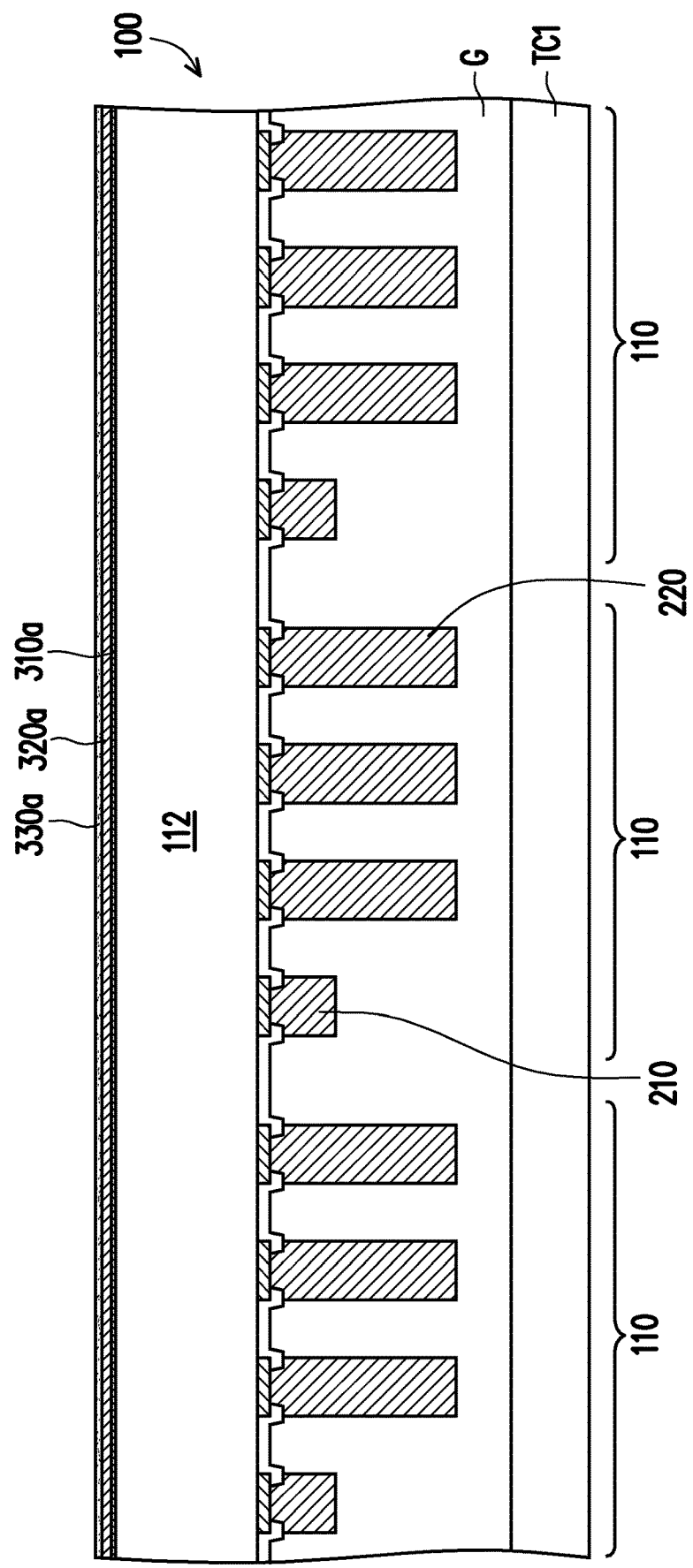
Figure 1E:
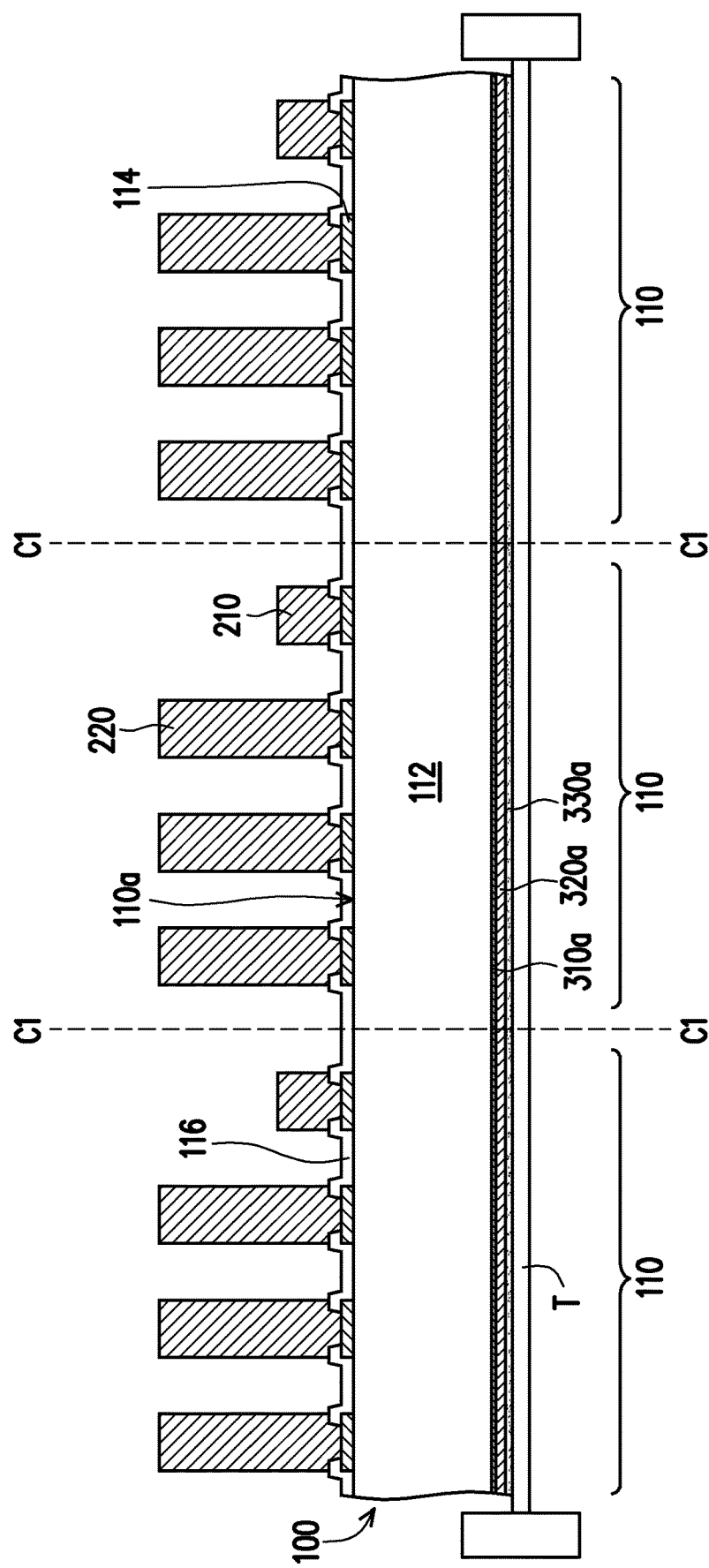
Figure 1F:
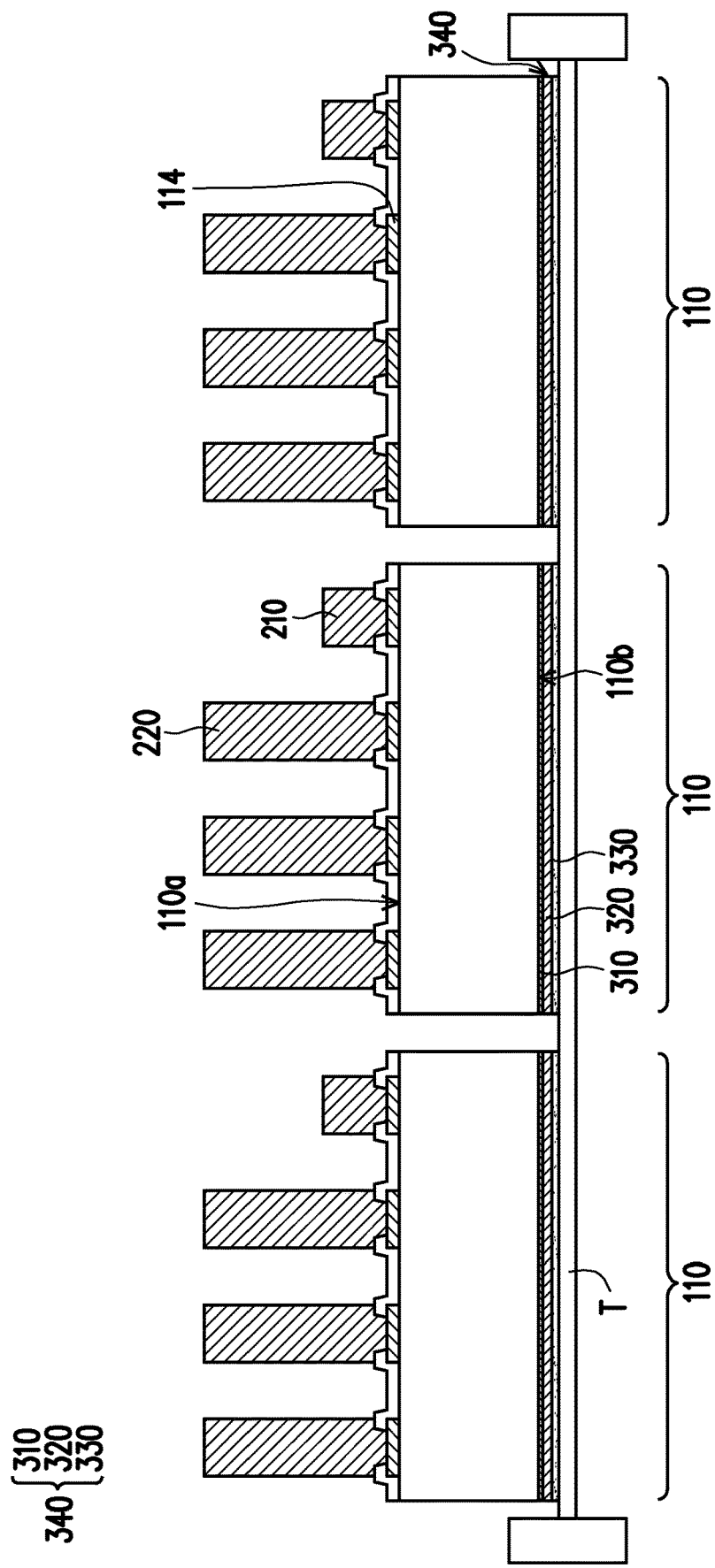
Figure 1G:
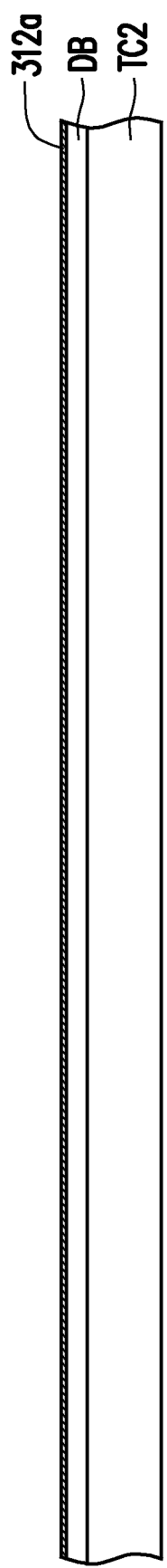
Figure 1H:
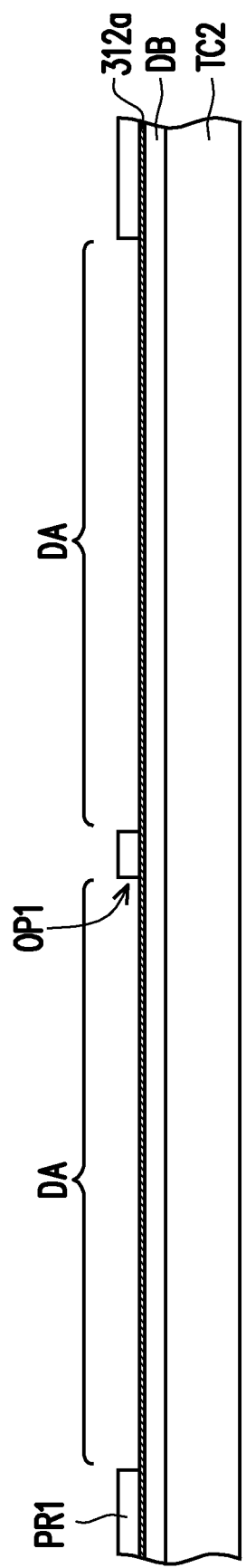
Figure 1I:
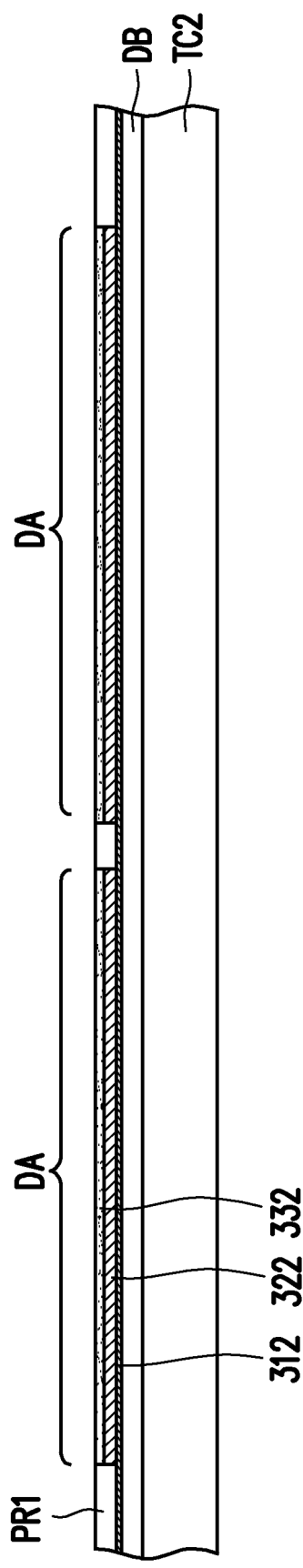
Figure 1J:
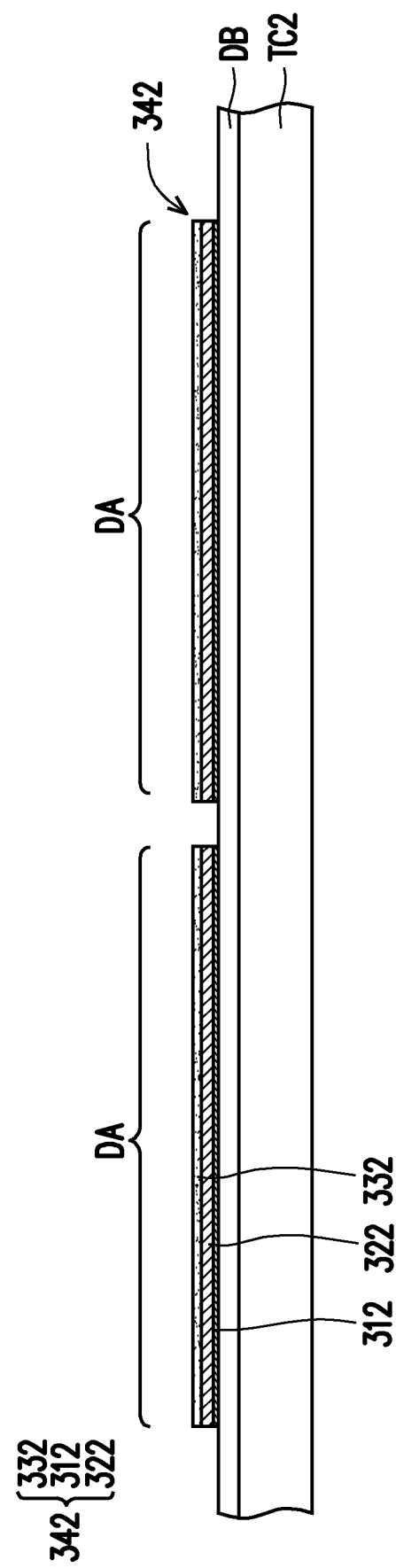
Figure 1K:
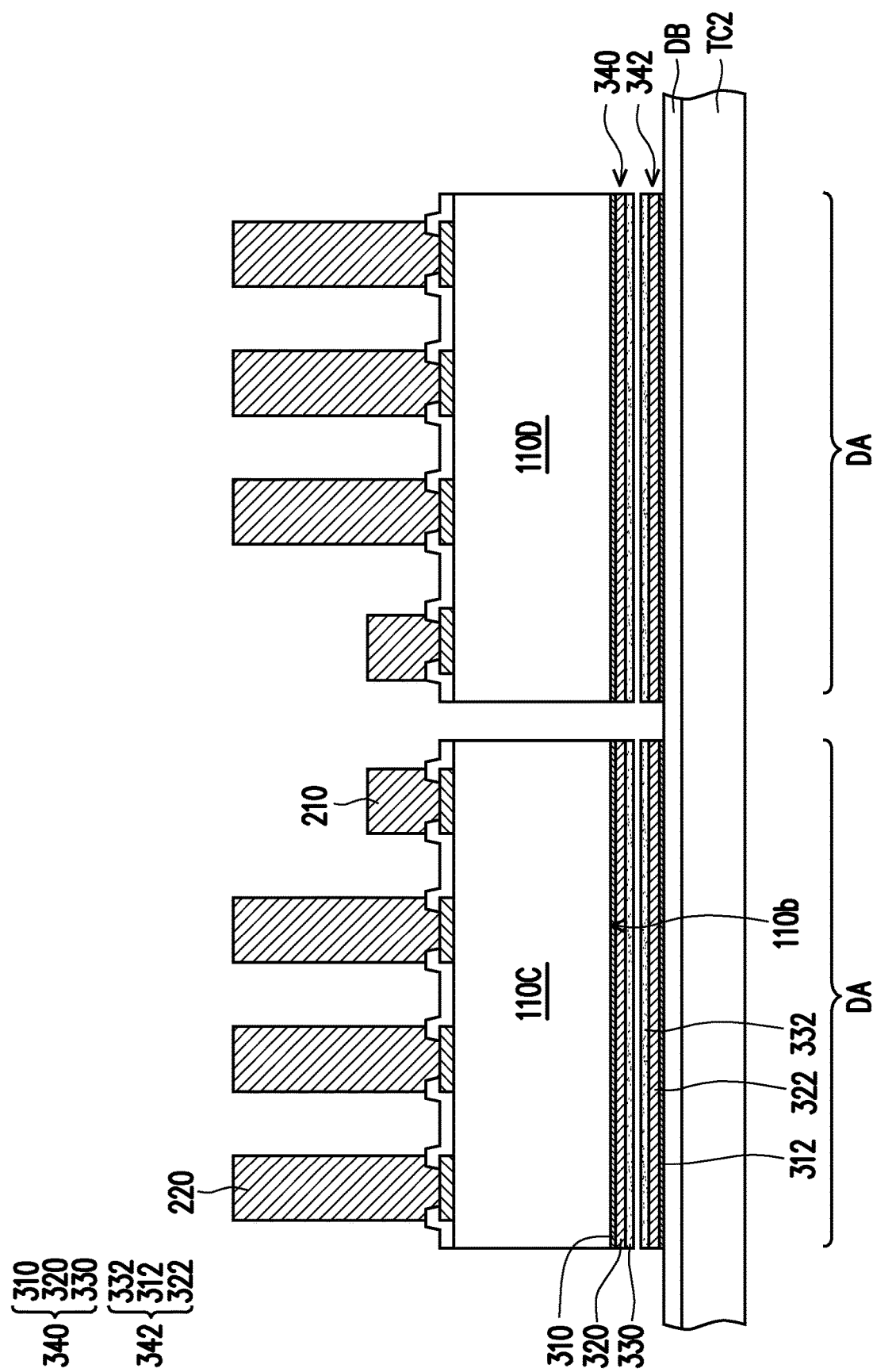
Figure 1L:
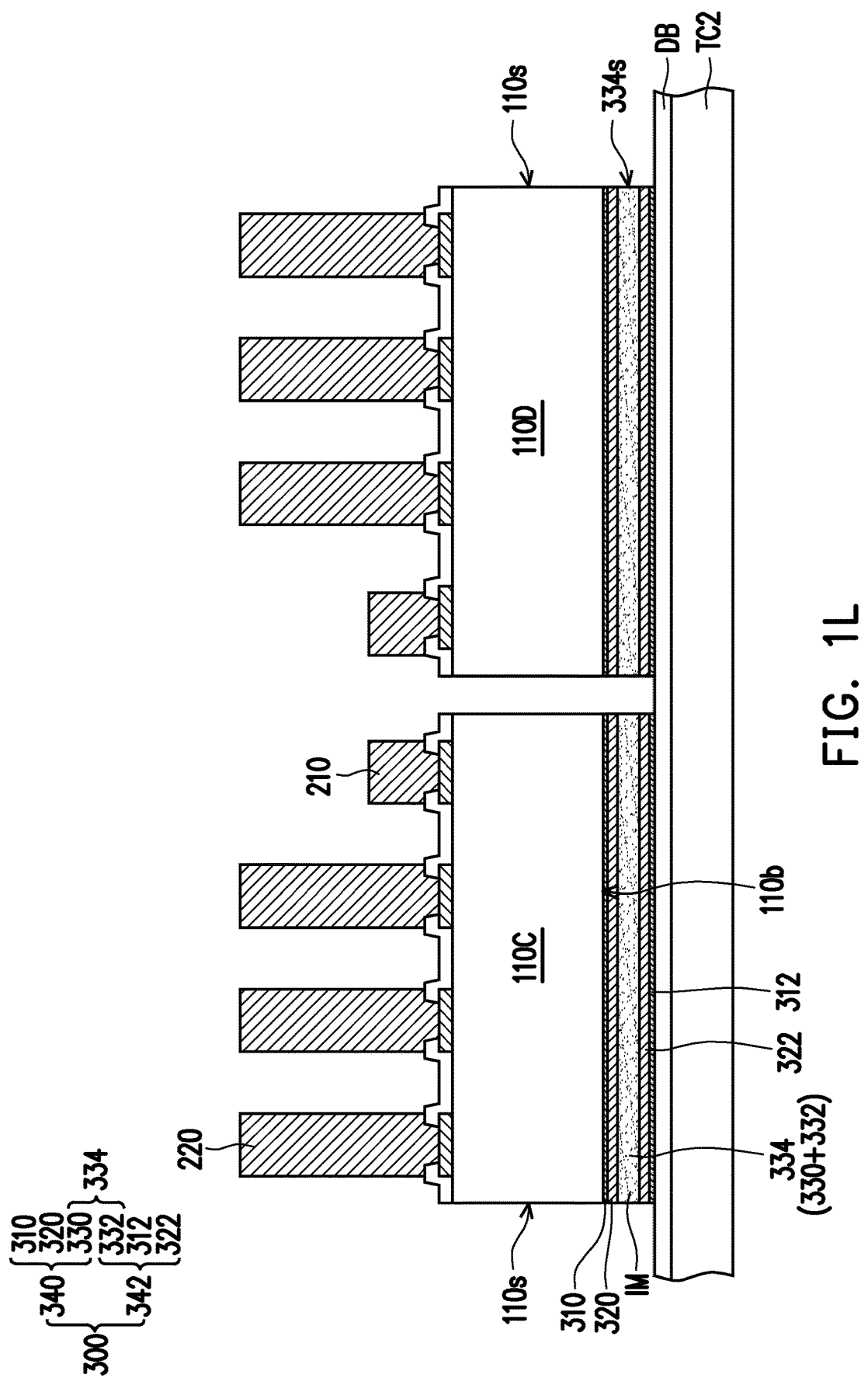
Figure 1M:
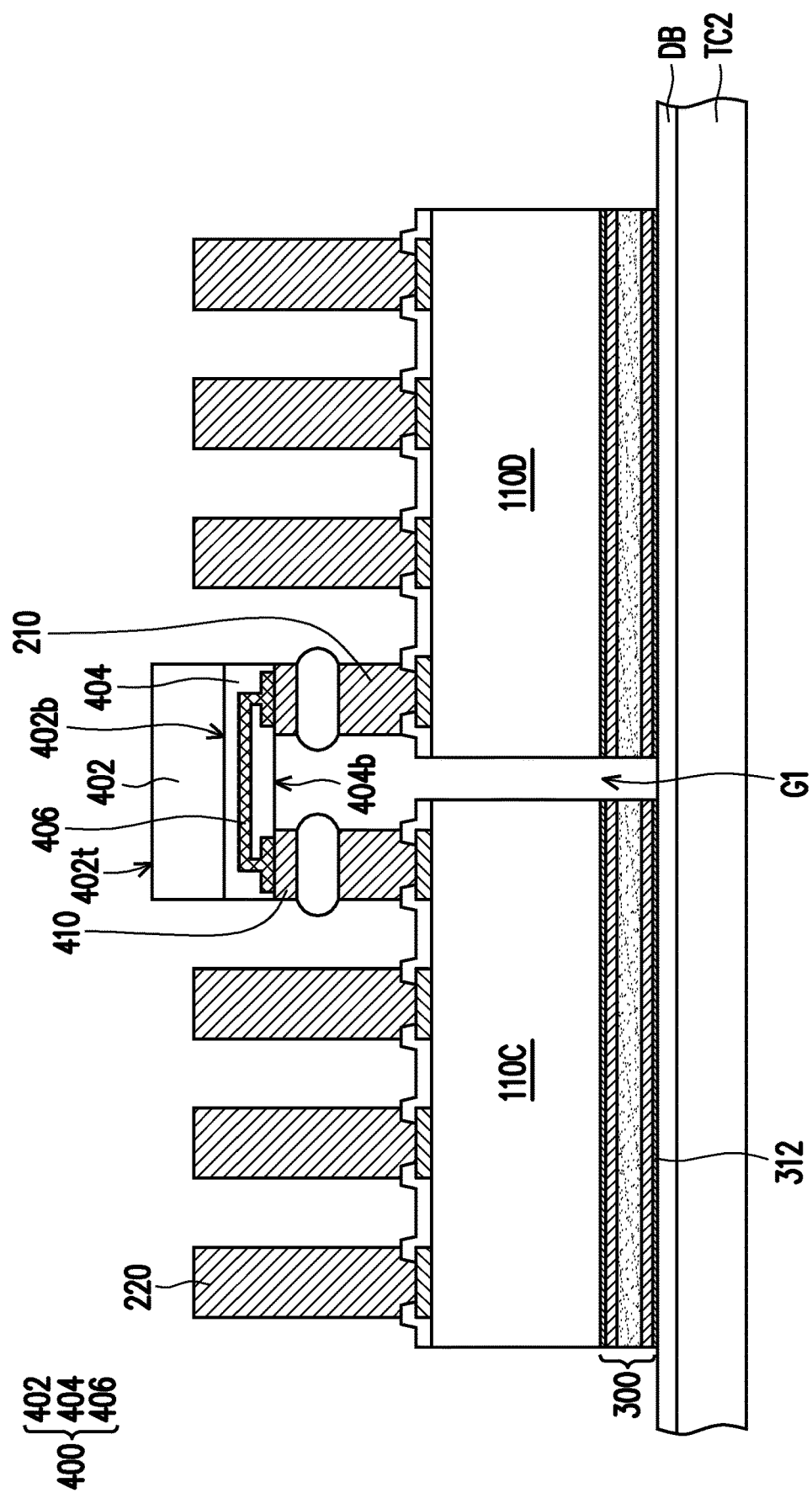
Figure 1N:
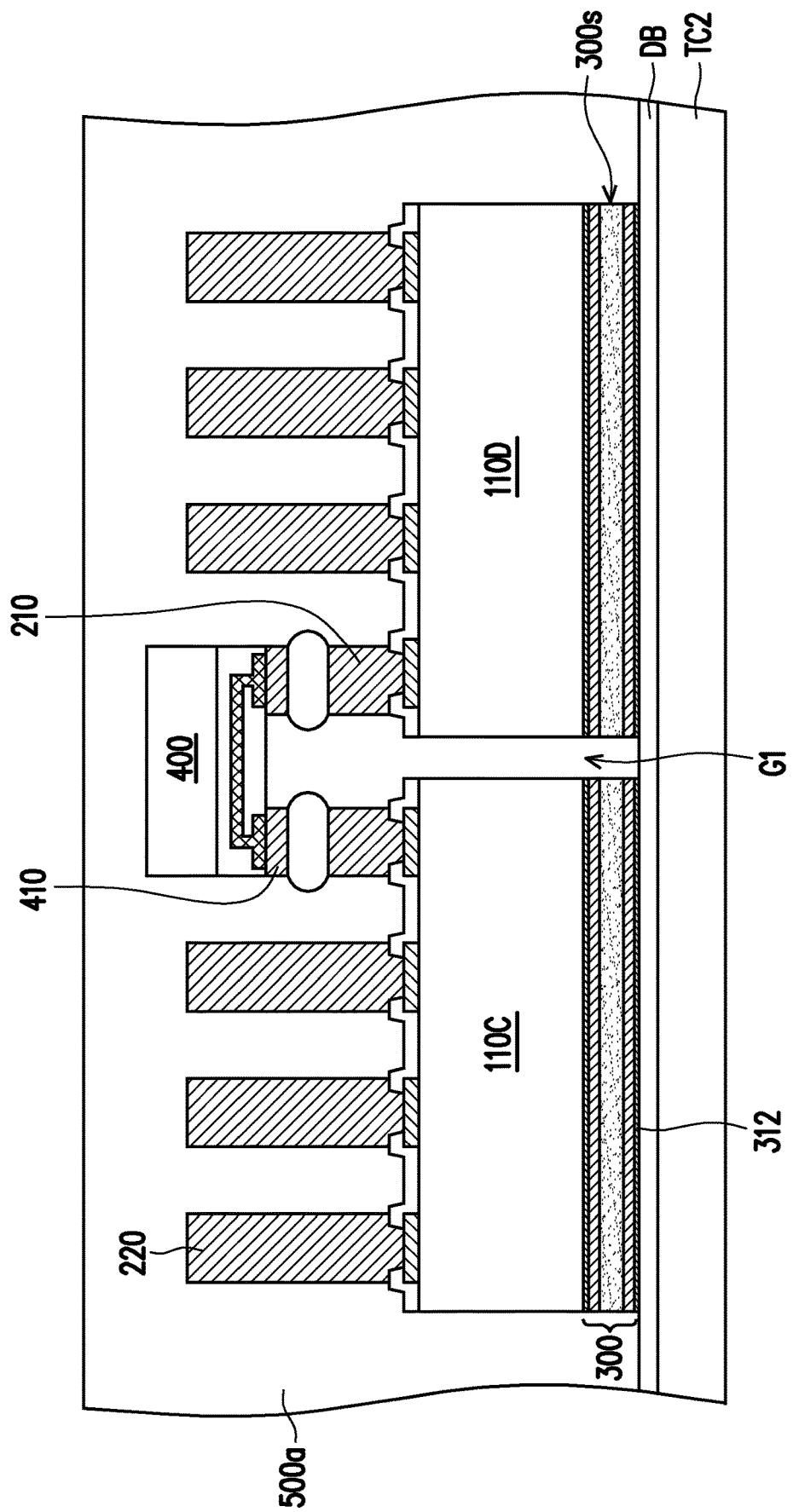
Figure 10:
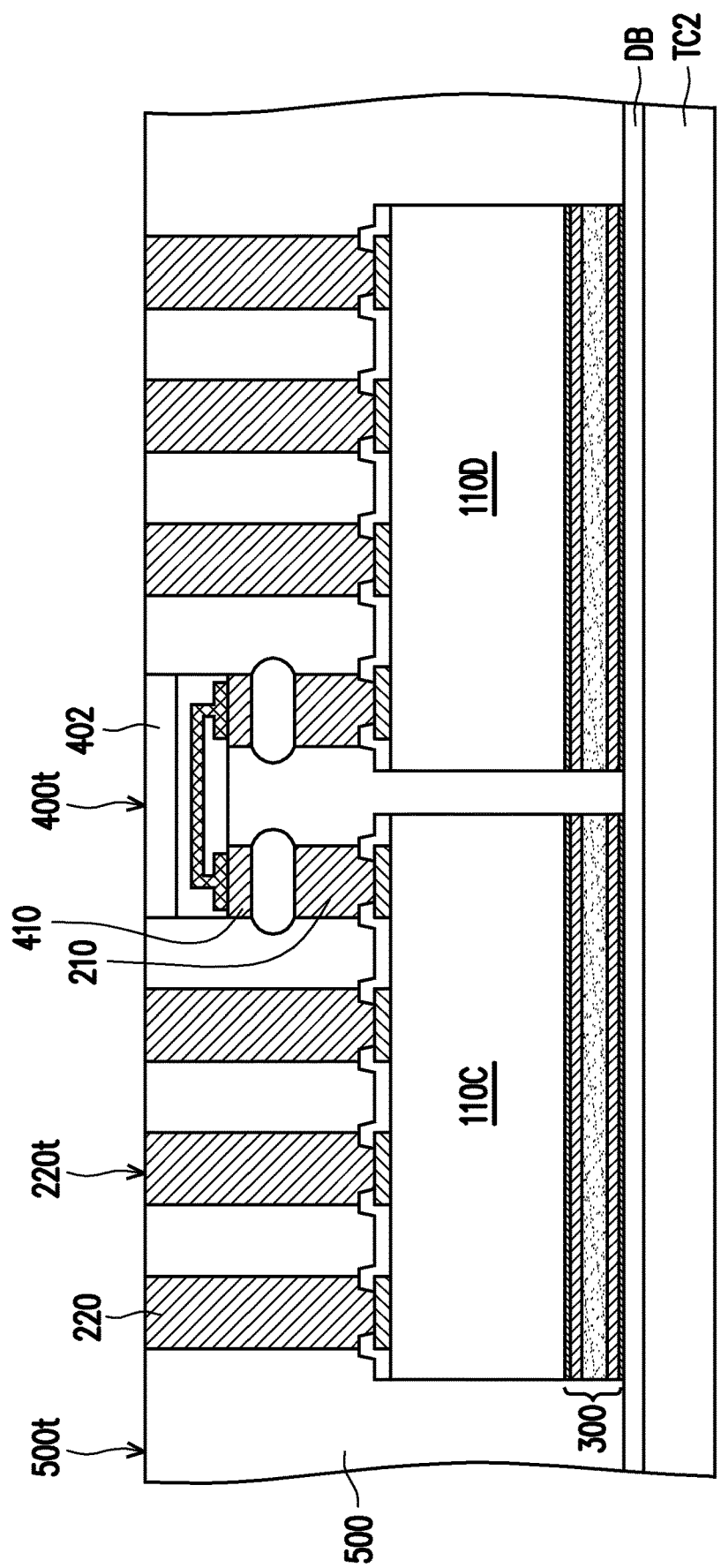
Figure 1P:
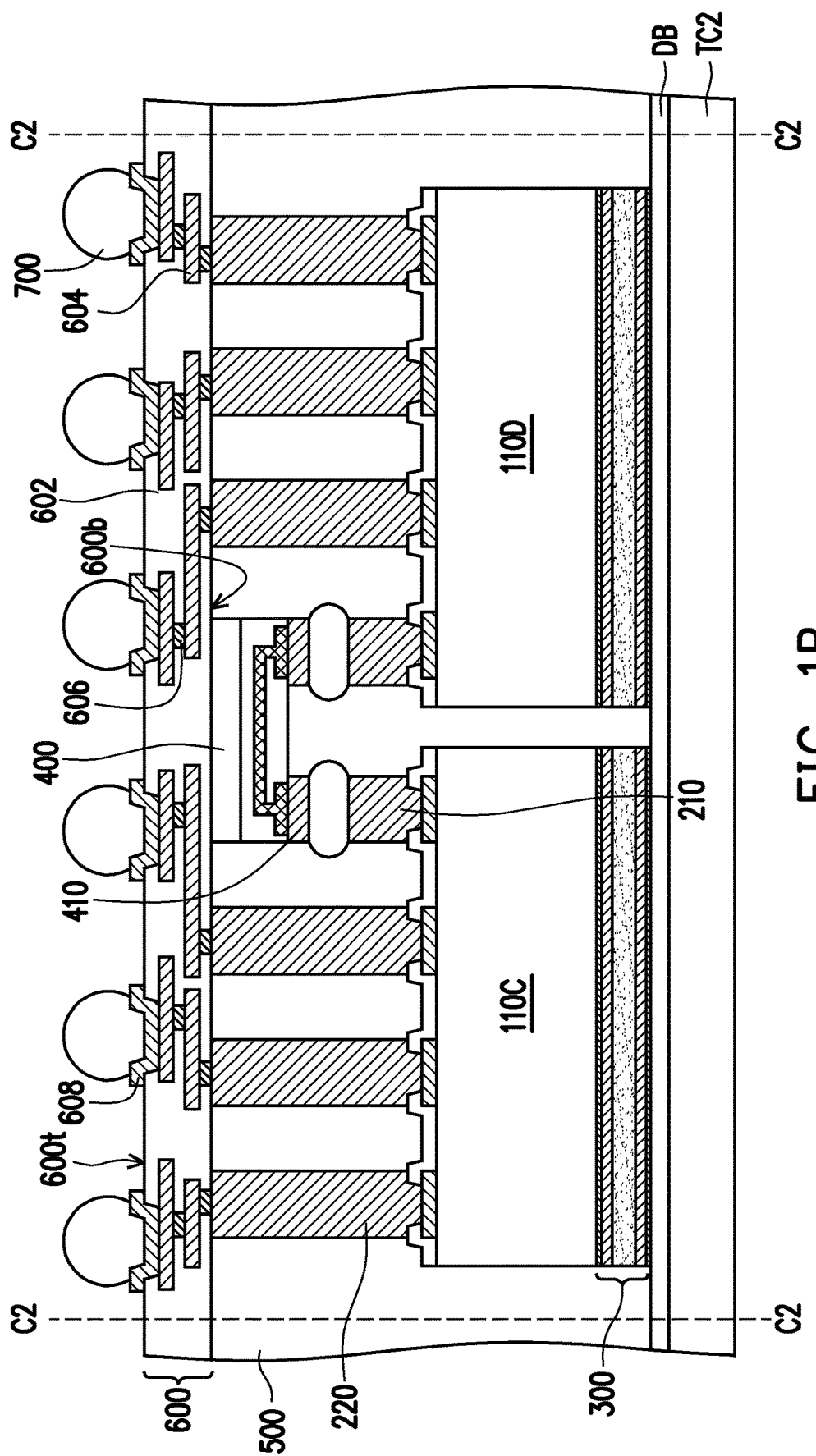
Figure 1Q:
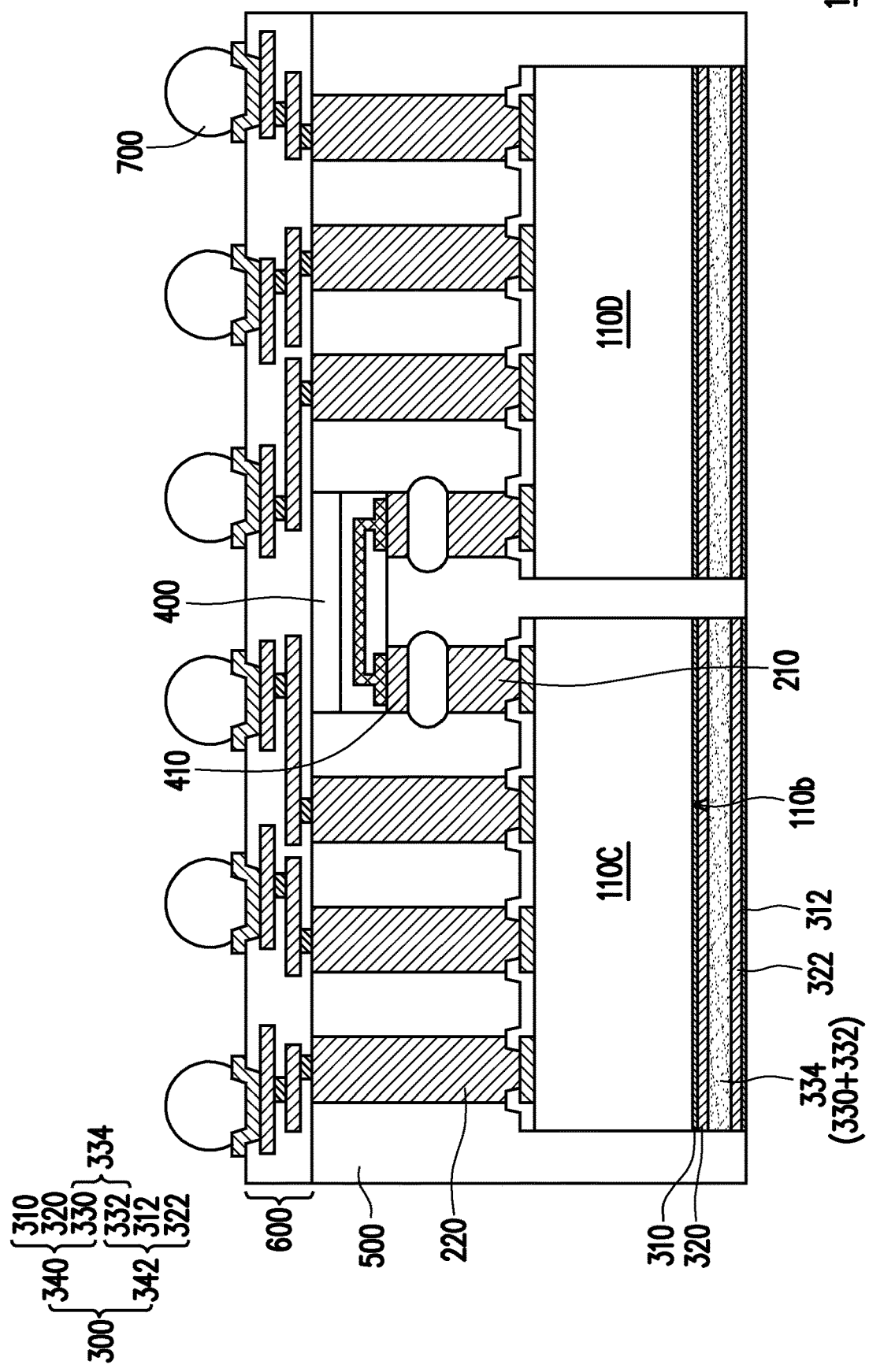
Figure 1R:
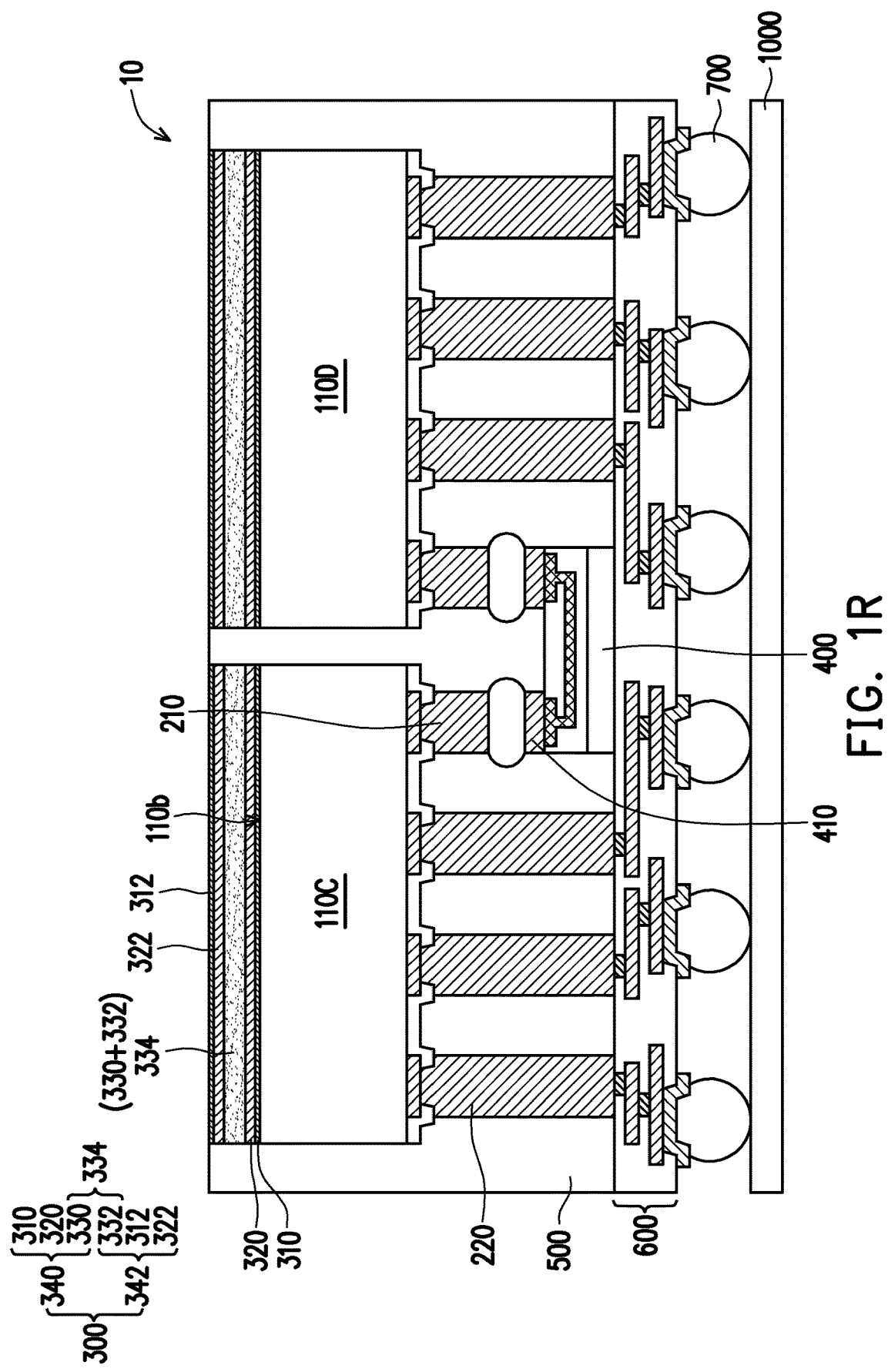

FIG. 1A through FIG. 1R show schematic cross-sectional views illustrating structures produced at various stages of a manufacturing method of a semiconductor package 10 shown in FIG. 1R. Referring to FIG. 1A, a semiconductor wafer 100 is provided. In some embodiments, the semiconductor wafer 100 may be a silicon bulk wafer. In some embodiments, the semiconductor wafer 100 may be a wafer made of semiconductor materials, such as semiconductor materials of the groups III-V of the periodic table. In some embodiments, the semiconductor wafer 100 may include elementary semiconductor materials such as silicon or germanium, compound semiconductor materials such as silicon carbide, gallium arsenic, indium arsenide, or indium phosphide or alloy semiconductor materials such as silicon germanium, silicon germanium carbide, gallium arsenic phosphide, or gallium indium phosphide. The semiconductor wafer 100 has a plurality of semiconductor dies 110 formed therein, and the dies 110 are parts of the semiconductor wafer 100 defined by the cut lines C1-C1. The semiconductor wafer 100 includes a semiconductor substrate 112, a plurality of conductive pads 114 on a frontside surface 100a of the semiconductor wafer 100 and a passivation layer 116 covering the frontside surface 100a of the semiconductor wafer 100. In some embodiments, three dies are shown to represent plural dies of the wafer, but the number of the dies in the wafer is not limited by the embodiments. For each of the semiconductor dies 110, the semiconductor die 110 may include active components (e.g., transistors or the like) and, optionally, passive components (e.g., resistors, capacitors, inductors, or the like) formed in the semiconductor substrate 112. Each of the semiconductor dies 110 may be or include a logic die, such as a central processing unit (CPU) die, a graphic processing unit (GPU) die, a micro control unit (MCU) die, an input-output (I/O) die, a baseband (BB) die, or an application processor (AP) die. In some embodiments, the semiconductor die 110 includes a memory die such as high bandwidth memory die.

Each die 110 may present a plurality of conductive pads 114 formed on an active surface (top surface) 110a of each die 110. Each top surface 110a may correspond to a portion of the frontside surface 100a of the semiconductor wafer 100. In certain embodiments, the conductive pads 114 include aluminum pads, copper pads, or other suitable metal pads. The passivation layer 116 extends over the frontside surface 100a of the semiconductor wafer 100, and the passivation layer 116 is formed with openings revealing the conductive pads 114. In some embodiments, the passivation layer 116 may be a single layer or a multi-layered structure, including a silicon oxide layer, a silicon nitride layer, a silicon oxy-nitride layer, a dielectric layer formed by other suitable dielectric materials or combinations thereof. The conductive pads 114 may be partially exposed by the openings of the passivation layer 116. In some embodiments, the semiconductor wafer 100 includes a plurality of first conductive vias 210 and a plurality of second conductive vias 220 formed on the conductive pads 114, through the openings of the passivation layer 116 and electrically connected with the conductive pads 114. In some embodiments, the material of the first conductive vias 210 and the second conductive vias 220 includes copper, copper alloys, or other conductive materials, and may be formed by deposition, plating, or other suitable techniques. In some embodiments, the formation of the first and second conductive vias 210, 220 includes forming one or more sacrificial masks (not shown) having a plurality of openings exposing the conductive pads 114, filling the openings with a conductive material (not shown) and removing the sacrificial masks to obtain the conductive vias 210 and 220. In some embodiments, the first conductive vias 210 and the second conductive vias 220 are formed with different heights. In some embodiments, a height $H_{210}$ of the conductive vias 210 may be less than a height $H_{220}$ of the conductive vias 220. In some embodiments, the design of different via pattern densities may lead to a height difference between the conductive vias 210 and 220. For example, regions of the masks with denser opening patterns (openings with tight spacing there-between) may result in shorter first conductive vias 210 than other regions of the masks with loosely arranged openings. In some alternative embodiments, the first conductive vias 210 and the second conductive vias 220 may be formed with the same height, and the second conductive vias 220 may be further elongated by selective deposition, thereby resulting in a height difference between the second conductive vias 220 and the first conductive vias 210. In some other alternative embodiments, rather than elongating the second conductive vias 220, the first conductive vias 210 are shortened, for example, by performing an etching step in the presence of an auxiliary mask (not shown) that shields the second conductive vias 220. Choice of a method to generate the height difference between the first 210 and second 220 conductive vias may be dictated by consideration such as overall cost of the process and the type of application intended for the dies. In any case, the method chosen to produce a difference in height between the first conductive vias 210 and the second conductive vias 220, or even the existence of a difference in height, are not to be construed as a limitation of the present disclosure. In the embodiments where a difference in height exists between the first conductive vias 210 and the second conductive vias 220, the height $H_{210}$ of the first conductive vias 210 may be in the range from 5 μm to 10 μm, and the height $H_{220}$ of the second conductive vias 220 may be in the range from 50 μm to 60 μm. However, the disclosure is not limited by the heights $H_{210}$, $H_{220}$ of the first 210 and second 220 conductive vias, as the heights $H_{210}$, $H_{220}$ may be adjusted according to the design or production requirements. In some alternative embodiments, the heights $H_{210}$, $H_{220}$ of the conductive vias 210 and 220 may be the same.

In some embodiments, the semiconductor wafer 100 is overturned and placed onto a temporary carrier TC1, as shown in FIG. 1B, and the conductive vias 210, 220 are embedded in a protective glue G formed on the carrier TC1. In FIG. 1B, the protective glue G may completely cover the conductive vias 210, 220 and be disposed between the semiconductor wafer 100 and the temporary carrier TC1. In some embodiments, the protective glue G may be a temporary bonding material and the protective glue G may include a light-to-heat conversion (LTHC) release layer for aiding the removal of the temporary carrier TC1 in the subsequent processes. In some embodiments, the temporary carrier TC1 is a glass substrate, a metal plate, a plastic supporting board or the like, but other suitable substrate materials may be used as long as the materials are able to withstand the subsequent steps of the process. When the semiconductor wafer 100 is disposed on the temporary carrier TC1 with the surface 100a facing the carrier TC1, a backside surface 100b of the semiconductor wafer 100 (opposite to the frontside surface 100a) is exposed and available for further processing.

Referring to FIG. 1C, in certain embodiments, a first seed material layer 310a is blanketly formed on the exposed backside surface 100b of the semiconductor wafer 100. In some embodiments, the first seed material layer 310a is formed directly on the exposed backside surface 100b to be in direct contact with the semiconductor wafer 100. The first seed material layer 310a may be formed through, for example, a sputtering process, a physical vapor deposition (PVD) process, or the like. In some embodiments, the first seed material layer 310a includes, for example, copper, tantalum, titanium-copper alloys, or other suitable materials. In some embodiments, a barrier layer (not shown) may be deposited before forming the first seed material layer 310a to prevent out-diffusion of the material of the first seed material layer 310a.

In some embodiments, as shown in FIG. 1D, a first metal layer 320a is formed over the first seed material layer 310a. For example, the first metal layer 320a may contain copper or other conductive metals, and may be formed by a plating technique such as electroplating or electroless plating, a sputtering process, or a PVD process. In one embodiment, a thickness of the first metal layer 320a is in the range between 1 μm to 30 μm, and may be adjusted according to design requirements. As shown in FIG. 1D, in certain embodiments, the first metal layer 320a blanketly covers the first seed material layer 310a. In some alternative embodiments, the first metal layer 320a is a patterned metal layer and partially covers the first seed material layer 320a. As shown in FIG. 1D, in certain embodiments, after the first metal layer 320a is formed, a first alloy layer 330a is formed on the first metal layer 320a. For example, the first alloy layer 330a may be formed by a plating technique such as electroplating or electroless plating, a sputtering process, a PVD process, a printing process, or the like. In one embodiment, a thickness of the first alloy layer 330a is in the range between 1 μm to 30 μm, and may be adjusted according to the design requirements. In some embodiments, the material of the first alloy layer 330a includes eutectic solder containing lead or lead-free. In some embodiments, the material of the first alloy layer 330a includes solder containing Sn—Ag, Sn—Cu, Sn—Ag—Cu, or similar soldering alloys. In some embodiments, the material of the first alloy layer 330a includes non-eutectic solder. In the embodiments where the first metal layer 320a is a patterned metal layer, the first alloy layer 330a is a patterned layer having the same pattern as the first metal layer 320a.

Referring to FIG. 1E and FIG. 1F simultaneously, following the formation of the first alloy layer 320a, the semiconductor wafer 100 is overturned and placed on a carrier tape T, and, after detaching and removing the temporary carrier TC1, the protective glue G is removed from the semiconductor wafer 100, thereby exposing the passivation layer 116 and the first and second conductive vias 210, 220 for each semiconductor die 110. In some embodiments, as shown in FIG. 1F, a singulation step is performed to separate the individual dies 110, for example, by cutting through the semiconductor wafer 100 along the cut lines C1-C1 (shown in FIG. 1E) as well as cutting through the first seed material layer 310a, the first metal layer 320a and the first alloy layer 330a. In the embodiments where the first metal layer 320a and the first alloy layer 330a are patterned layers, the singulation step is performed to cut through the semiconductor wafer 100 and the first seed material layer 310a. In some embodiments, the singulation process typically involves performing a wafer dicing process with a rotating blade and/or a laser beam. In some embodiments, a wet cleaning step may be performed to remove residuals of the protective glue G before dicing the semiconductor wafer 100. After the singulation step, each die 110 may include a plurality of first conductive vias 210 and second conductive vias 220 connected to the conductive pads 114 on the top surface 110a, and a first stacked layer 340 disposed on a rear surface 110b opposite to the top surface 110a. In some embodiments, the first stacked layer 340 includes a first seed layer 310, a first metal layer 320, and a first alloy layer 330 stacked in sequence from the rear surface 110b. In certain embodiments, the first stacked layer 340 fully covers the whole rear surface 110b of the die 110.

In FIG. 1G, a temporary carrier TC2 having a de-bonding layer DB formed thereon is provided. The temporary carrier TC2 may be made of the same materials as the temporary carrier TC1, and a detailed description thereof is omitted for brevity. In some embodiments, the de-bonding layer DB includes a light-to-heat conversion (LTHC) release layer, which facilitates peeling the temporary carrier TC2 away from the semiconductor package when required by the manufacturing process. In some embodiments, a second seed material layer 312a is formed over the de-bonding layer DB. Formation of the second seed material layer may use similar processes and materials as previously described for the first seed material layer 310a with reference to FIG. 1C, and a detailed description thereof is omitted herein. In some embodiments, the second seed material layer 312a includes, for example, copper, tantalum, titanium-copper alloys, or other suitable materials.

Referring to FIG. 1H, a patterned photoresist PR1 is subsequently formed on the second seed material layer 312a. In some embodiments, the patterned photoresist PR1 may include a plurality of openings OP1 exposing portions of the second seed material layer 312a. In some embodiments, in FIG. 1H, each of the openings OP1 corresponds to a region where a semiconductor die (not shown) is to be placed (die attach location DA) in a subsequent step of the process. In some alternative embodiments, the patterned photoresist may expose only one or a few portions of each region where a die is to be disposed. In some embodiments, the patterned photoresist PR1 may be formed through exposure and development. In some embodiments, the region of the carrier where the semiconductor dies are going to be attached downstream along the process is neatly defined through photolithographic techniques. As such, the die attach locations are precisely defined and accuracy of the subsequent die attachment step can be increased.

Referring to FIG. 1I, a second metal layer 322 and a second alloy layer 332 are sequentially formed in the openings OP1 of the patterned photoresist PR1 and fill up the openings OP1 of the patterned photoresist PR1. The formation of the second metal layer 322 and the second alloy layer 332 may use the same or similar materials and formation methods of the first metal layer 320a and the first alloy layer 330a, respectively, and a detailed description thereof is omitted herein. In some embodiments, the second metal layer 322 may contain copper or other conductive metals. In some embodiments, the material of the second alloy layer 332 includes eutectic solder containing lead or lead-free. In some embodiments, the material of the second alloy layer 332 includes solder containing Sn—Ag, Sn—Cu, Sn—Ag—Cu, or similar soldering alloys. In some embodiments, the material of the second alloy layer 332 includes non-eutectic solder. In some embodiments, a thickness of the second metal layer 322 and a thickness of the second alloy layer 332 may be, independently of each other, in the range between 1 μm to 30 μm, but the disclosure is not limited thereto. The thickness of either layer 322, 332 may be adjusted according to design or performance requirements.

In FIG. 1J, the patterned photoresist PR1 is removed, for example by using a stripping solution or through an etching or ashing process, whereby the portions of the second seed material layer 312a not covered by the second metal layer 322 are exposed. In some embodiments, the exposed portions of the second seed metal layer 312a may be subsequently removed, for example via an etching process, to yield a patterned second seed layer 312 between the second metal layer 322 and the de-bonding layer DB. As shown in FIG. 1J, a second stacked layer 342 is formed in each die attach location DA, and the second stacked layer 342 includes a second seed layer 312, a second metal layer 322 and a second alloy layer 332 stacked in sequence on the de-bonding layer DB. In FIG. 1J, two die attach locations DA are shown and the second stacked layers 342 are disposed flanking each other on the de-bonding layer DB. It will be apparent to those of ordinary skill in the art that, whilst only two stacks of stacked layers are shown in FIG. 1J, several pairs of stacks or stacks in arrays can be formed simultaneously on the temporary carrier TC2. In other words, the steps of the disclosed methods can be performed in a parallel fashion to simultaneously produce a plurality of semiconductor packages 10 (shown in FIG. 1Q). A singulation step can be included after any stage of the method to produce individual semiconductor packages 10 or manufacturing intermediates thereof, according to the production requirements.

Referring to FIG. 1K and FIG. 2A simultaneously, a first semiconductor die 110C is disposed on one of the two stacks of the second stacked layers 342 and a second semiconductor die 110D is disposed on the other stack of the second stacked layers 342. In other words, in each die attach location DA, one semiconductor die is attached to each stack of second stacked layers 342. In some embodiments, the semiconductor dies 110C, 110D may be the same type of dies or perform the same functions. In some embodiments, the semiconductor dies 110C, 110D may be different types of dies or perform different functions. In some embodiments, the first semiconductor die 110C or the second semiconductor die 110D may be or include a logic die. The disclosure is not limited by the type of dies used for the semiconductor dies 110C, 110D. In some embodiments, the semiconductor dies 110C and 110D have been produced according to the method previously described with reference to FIGS. 1A-1F, and, as such, one or both of the dies 110C, 110D present the stack of first stacked layers 340 including the first seed layer 310, the first metal layer 320 and the first alloy layer 330 stacked on a rear surface 110b thereof. In some embodiments, the semiconductor dies 110C, 110D are disposed on the temporary carrier TC2 in such a way that the stack of first stacked layers 340 of one semiconductor die is attached to one stack of the second stacked layers 342 in each die attach location DA. In certain embodiments, the first alloy layer 330 of each semiconductor die 110C or 110D faces the second alloy layer 332 of the corresponding underlying stack of second stacked layers 342, in a configuration where the stack of first stacked layer 340 is aligned with one stack of the second stacked layer 342. In some embodiments, the first die 110C and the second die 110D are arranged side by side and are so arranged that at least one first conductive via 210 of the first die 110C and one first conductive via 210 of the second die 110D form a pair of conductive vias that are most adjacent to each other (with the shortest horizontal distance between the two conductive vias of the pair). In some embodiments, the semiconductor dies 110C and 110D may be disposed in such a way that no second conductive via 220 is interposed between the first conductive via 210 of the first die 110C and the first conductive via 210 of the second die 110D, but the disclosure is not limited thereto.

In some embodiments, the dies 110C, 110D are placed on the temporary carrier TC2 by a pick and place process, and might be disposed in a somewhat misaligned manner with respect to the spans of the stacks of the second stacked layers 342. In other words, a pick and place process may introduce a shift between the intended position DA of the die and the position where each die 110C or 110D is effectively placed. In one embodiment, as shown in FIG. 2A, the intended positions of the dies DA are illustrated by the dashed lines (substantially the span of the stack of second stacked layers 342), and the placed position of the die 110C or 110D is illustrated as the dotted region (substantially the span of the stack of first stacked layers 340). In some embodiments of the present disclosure, after the pick and place process, the placed position of each die 110C or 110D may be shifted by about 1 μm with respect to the corresponding intended position DA.

Referring to FIG. 1L and FIG. 2B simultaneously, a reflow process is performed to join the first alloy layer 330 with the second alloy layer 332, thereby producing a joint alloy layer 334. The reflow temperature and the processing time of the reflow process can be optimized depending on the composition of the first alloy layer 330 and the second alloy layer 332. In some embodiments, intermetallic compounds or an intermetallic layer IM is formed in the joint alloy layer 334 by reflowing and joining together the adjacent two alloy layers. During the reflow process to form the joint alloy layer 334, the joining of the first alloy layer 330 with the second alloy layer 332 can make the first stacked layer 340 of the shifted semiconductor die 110C or 110D align with the underlying stack of the second stacked layer 342, improving the alignment between the semiconductor dies 110C, 110D and the corresponding stacks of the second stacked layers 342. As such, after the reflow process, a misalignment between the position of the stack of the second stacked layer 342 and the position of the overlying semiconductor die 110C or 110D may be further reduced. In some embodiments, reduction of the shift can be observed and the semiconductor dies are attached to the intended positions on the de-bonding layer DB in a self-aligned way even when an initial shift is about 1 μm. In some embodiments, as shown in FIG. 1L, the joint alloy layer 334 has side edges 334s substantially aligned with side surfaces 110s of the semiconductor dies 110C, 110D. In some embodiments the joint alloy layer 334 may somewhat protrude with respect to the side surface 110s, depending on the amount of material used for the first 330 and second 332 alloy layers. In certain embodiments, the reflow process solders together the first stacked layers 340 on the rear surfaces 110b of the semiconductor dies 110C, 110D with the corresponding stacks of the second stacked layers 342 formed on the temporary carrier TC2, thereby forming self-aligned structures 300. In other words, the self-aligned structure 300 attaches each semiconductor die 110C or 110D to the temporary carrier TC2. Furthermore, each self-aligned structure 300 at least partially corrects a shift in the position of each semiconductor die 110C or 110D that may have been introduced during the die placement step. Hence, better alignment of the die placement is achieved, which is beneficial for the packages with fine pitch or smaller form factors. In addition, the process window for the pick and place process is enlarged and higher throughput is achieved.

In some embodiments, the self-aligned structure 300 covers the entire rear surface 110b of the semiconductor dies 110C, 110D, as shown in FIGS. 1L and 1n FIG. 2B, but the disclosure is not limited thereto. In some alternative embodiments, the self-aligned structure 300 may be formed with the patterned first stacked layer 340 not covering the entire rear surface 110b of the semiconductor die 110C or 110D. In some alternative embodiments, the self-aligned structure 300 may be formed with the patterned second stacked layer 342 not covering the entire span of the intended positions of the semiconductor dies 110C, 110D on the de-bonding layer DB. In some other embodiments, the self-aligned structure 300 may be formed with patterned first and second stacked layers 340, 342. As shown in FIGS. 2C and 2D, multiple self-aligned structures 300 may be formed for each semiconductor die 110C or 110D. The self-aligned structures 300C and 300D are shown as multiple square patches or multiple circular patches arranged within each die attach location (shown in dashed line), respectively, but the disclosure is not limited neither by the number nor by the shape of the self-aligned structures 300. In some embodiments, a coverage of the rear surface 110b of each semiconductor die 110C or 110D by one or more self-aligned structures 300 is in the range from 5% to 100%.

In FIG. 1M, a bridge structure 400 is bonded to both of the first semiconductor die 110C and the second semiconductor die 110D, to establish electrical connection between the two semiconductor dies 110C and 110D. As shown in FIG. 1M, in some embodiments, the bridge structure 400 includes a semiconductor substrate 402, a dielectric layer 404 disposed on a bottom surface 402b of the semiconductor substrate 402, and a conductive pattern 406 embedded in the dielectric layer 404. In some embodiments, the bridge structure 400 further includes through vias (e.g. through silicon vias) formed in the semiconductor substrate 402, establishing electrical connection between the bottom surface 402b and an opposite top surface 402t. In some embodiments, the bridge structure 400 electrically connects the two semiconductor dies 110C and 110D through their respective first conductive vias 210. In some embodiments, the bridge structure 400 further includes a plurality of connectors 410 disposed on a bottom surface 404b of the dielectric layer 404 and connected to the conductive pattern 406. In some embodiments, the connectors 410 are micro-bumps containing copper posts and solder caps, but the disclosure is not limited thereto, and other conductive structures such as solder bumps, gold bumps or metallic bumps may also be used as the connectors 410. The connectors 410 may be bonded to the first conductive vias 210 through a reflow process. Upon bonding the bridge structure 400 to the semiconductor dies 110C, 110D, electrical connection between the semiconductor dies 110C and 110D is established through the first conductive vias 210, the connectors 410 and the conductive patterns 406. In some embodiments, the bridge structure 400 connects at least one first conductive via 210 of the first semiconductor die 110C with at least one first conductive via 210 of the second semiconductor die 110D. In some embodiments, the bridge structure 400 connects one or more first conductive vias 210 of the first semiconductor die 110C with one or more first conductive vias 210 of the second semiconductor die 110D. In some embodiments, where a gap G1 exists between the adjacent semiconductor dies 110C, 110D, the bridge structure 400 extends over such gap G1. In some embodiments, the bridge structure functions as an interconnecting structure for the semiconductor dies 110C, 110D and provides shorter electrical connection path between the two semiconductor dies 110C, 110D.

Figure 3A:
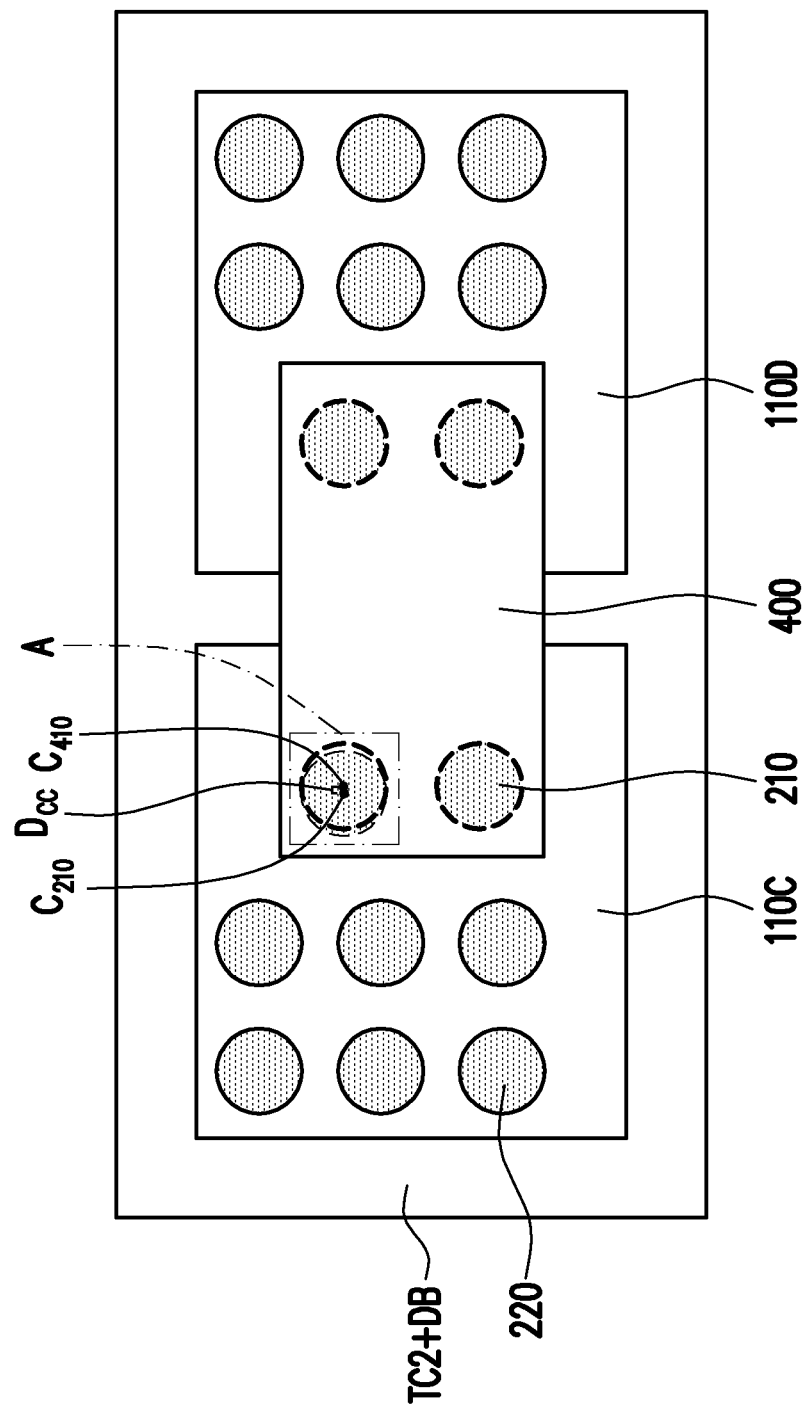
FIG. 3A and FIG. 3B are schematic top views of a structure produced at various stages of a manufacturing method of a semiconductor package according to some embodiments of the present disclosure.
Figure 3B:
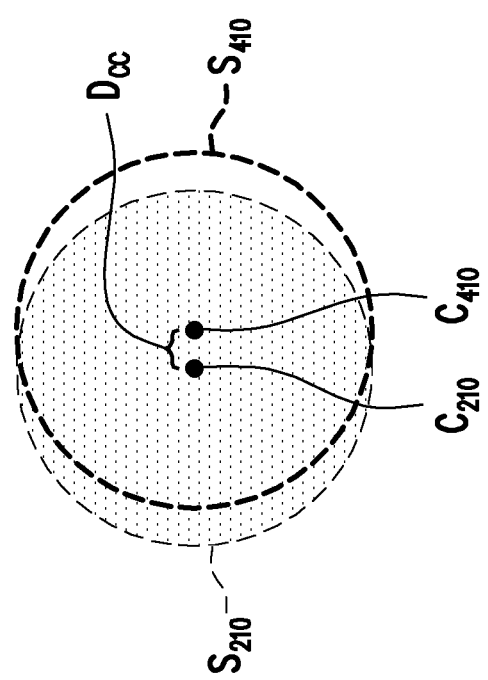

In FIG. 3A is shown a schematic top view of the manufacturing intermediate stage of FIG. 1M, whilst in FIG. 3B is shown an enlarged top view of the area A outlined in FIG. 3A. In some embodiments, because the formation of the self-aligned structure 300 (shown in FIG. 1M) corrected or improved at least partially a shift of the semiconductor dies 110C, 110D with respect to the originally intended positions, an alignment of the bridge structure 400 with the first conductive vias 210 is also improved. In some embodiments, the improved alignment of the bridge structure 400 with the first conductive vias 210 may increase the overlap between a horizontal section $S_{210}$ of a first conductive via 210 and a horizontal section $S_{410}$ of a connector 410. In some embodiments, a center $C_{210}$, $C_{410}$ of the horizontal sections $S_{210}$, $S_{410}$ is defined as the point minimizing the sum of the squared distances between the point itself and the outline (geometric center) of the corresponding horizontal section $S_{210}$, $S_{410}$. In some embodiments, the improved alignment of the bridge structure 400 with the first 110C and second 110D semiconductor dies may result in a significant reduction of a distance $D_{cc}$ between the centers $C_{210}$ and $C_{410}$ of the horizontal sections $S_{210}$ and $S_{410}$. In some embodiments, the distance $D_{cc}$ may be less than about 3 microns. As a non-limiting example, if the connectors 410 and the first conductive vias 210 have a cylindrical shape, the outline of the respective horizontal sections $S_{410}$, $S_{210}$ may be close to a circumference, and the center of each circumference may correspond to the center $C_{410}$, $C_{210}$ of the horizontal sections $S_{410}$, $S_{210}$. It will be apparent to the person skilled in the art that the above definition of center of a horizontal section can be applied to any shape of the first conductive vias 210 or of the connectors 410, and that the disclosure is not intended to be limited by the shape chosen for those components. As the shift of the die placement is minimized, better alignment and reliable connection of the bridge structure to the dies are attained, and the electrical performance of the package is enhanced.

Referring to FIG. 1N, an encapsulation material 500a is formed over the temporary carrier TC2 to encapsulate the semiconductor dies 110C, 110D, the self-aligned structures 300, the bridge structure 400, the first conductive vias 210 and the second conductive vias 220. In some embodiments, the second conductive vias 220 and the bridge structure 400 are fully covered and not revealed by the encapsulation material 500a. In some embodiments, the encapsulation material 500a at least covers a side surface 300s of the self-aligned structure, and may further fill the gap G1 between the semiconductor dies 110C, 110D. In some embodiments, the encapsulation material 500a includes a molding compound, a molding underfill, a resin (such as an epoxy resin), or the like. In some embodiments, the encapsulation material 500a is formed by an over-molding process. In some embodiments, the encapsulation material 500a is formed by a compression molding process.

Referring to FIG. 1N and FIG. 1O, in some embodiments, the encapsulation material 500a may be partially removed by a planarizing process until the top surface 400t of the bridge structure 400 and the top surfaces 220t of the second conductive vias 220 are exposed. In some embodiments, upper portions of the conductive vias 220 and/or an upper portion of the bridge structure 400 may also be removed during the planarizing process. Planarization of the encapsulation material 500a may produce an encapsulant 500 located over the temporary carrier TC2 to encapsulate the conductive vias 210, 220, the semiconductor dies 110C, 110D, and the bridge structure 400. In some embodiments, the planarization of the encapsulation material 500a and/or the bridge structure 400 includes performing a mechanical grinding process and/or a chemical mechanical polishing (CMP) process. After the grinding process or the polishing process, the top surfaces 220t of the conductive vias 220 and the top surface 400t of the bridge structure 400 may be substantially coplanar with a top surface 500t of the encapsulant 500.

As shown in FIG. 1P, in some embodiments, a redistribution structure 600 is subsequently formed over the encapsulant 500, the second conductive vias 220 and the bridge structure 400. As shown in FIG. 1P, the redistribution structure 600 includes one or more dielectric layers 602, one or more conductive layers 604, and a plurality of interconnecting vias 606. Each conductive layer 604 may be constituted by a plurality of redistribution conductive patterns. For simplicity, the dielectric layer 602 is illustrated as one single dielectric layer, with the conductive layers 604 embedded therein. Nevertheless, from the perspective of the manufacturing process, the dielectric layer 602 is constituted by multiple dielectric layers and each conductive layer 604 is sandwiched between the two adjacent dielectric layers. As illustrated in FIG. 1P, the interconnecting vias 606 are also embedded in the dielectric layer 602. In some embodiments, materials of the conductive layer 604 and the interconnecting vias 606 include aluminum, titanium, copper, nickel, tungsten, and/or alloys thereof. The conductive layer 604 may be formed by, for example, electroplating, deposition, and/or photolithography and etching. In some embodiments, the material of the dielectric layer 602 includes polyimide, epoxy resin, acrylic resin, phenol resin, benzocyclobutene (BCB), polybenzoxazole (PBO), or any other suitable polymer-based dielectric material. The dielectric layer 602, for example, may be formed by suitable fabrication techniques such as spin-on coating, chemical vapor deposition (CVD), plasma-enhanced chemical vapor deposition (PECVD), or the like. It should be noted that the number of the conductive layers 604 and the number of the dielectric layers 602 may be adapted according to the design requirement, and do not constitute a limitation of the disclosure. In some alternative embodiments, more or fewer conductive layers and more or fewer dielectric layers may be formed depending on the circuit design.

Referring to FIG. 1P, at least a portion of the conductive vias 606 is exposed by a bottom surface 600*b* of the redistribution structure 600, and is electrically connected to the second conductive vias 220. Furthermore, the redistribution structure 600 may present, on a top surface 600*t* opposite to the bottom surface 600*b*, a plurality of under bump metallurgies 608 electrically connected to at least a portion of the conductive layers 604. A plurality of connective terminals 700 is disposed on the under-bump metallurgies 608, through which is electrically connected to the redistribution structure 600. In some embodiments, the connective terminals 700 include solder balls. In some embodiments, the connective terminals 700 may be placed on the under-bump metallurgies 608 patterns through a ball placement process.

Referring to FIG. 1P, after the connective terminals 700 are formed on the redistribution structure 600, a singulation process is performed to dice the structure illustrated in FIG. 1P along the cut lines C2-C2 to form a plurality of semiconductor packages 10. In some embodiments, the singulation process involves performing a wafer dicing process with a rotating blade or a laser beam. In other words, the dicing or singulation process is a laser cutting process, a mechanical cutting process, or any other suitable process.

Referring to FIG. 1P and FIG. 1Q, the de-bonding layer DB and the temporary carrier TC2 are detached from the packages 10 and then removed, so that the surface of the self-aligned structure 300 is exposed. In some embodiments, the de-bonding layer DB (e.g., the LTHC release layer) is irradiated with a UV laser so that the carrier TC2 and the de-bonding layer DB are easily peeled off from the packages 10. Nevertheless, the de-bonding process is not limited thereto, and other suitable de-bonding methods may be used in some alternative embodiments.

Based on the above, in some embodiments, a semiconductor package 10 includes a first 110C and a second 110D semiconductor dies bearing a plurality of first conductive vias 210 interconnected through a bridge structure 400, and a plurality of second conductive vias 220 establishing electrical connection with a redistribution structure 600. A self-aligned structure 300 is built on the rear surface 110*b* of each die 110C or 110D. In some embodiments, the self-aligned structure is formed by joining together a first stacked layer 340 formed on the rear surface 110*b* of each semiconductor die 110C or 110D, to a second stacked layer 342. The stacked layer 340 includes a seed layer 310, a metal layer 320 and an alloy layer 330. The stacked layer 342 includes a seed layer 312, a metal layer 322 and an alloy layer 332. In some embodiments, the self-aligned structure 300 is formed by soldering the two alloy layers 330, 332 to produce a joint alloy layer. The first conductive vias 210, the second conductive vias 220, the first semiconductor die 110C, the second semiconductor die 110D, the self-aligned structure 300, and the bridge structure 400 are enclosed by the encapsulant 500. A redistribution structure 600 is formed over the encapsulant 500 and is electrically connected to the second conductive vias 220, and a plurality of connective terminals 700 is located on and electrically connected with the redistribution structure 600.

As shown in FIG. 1R, the package structure 10 may be mounted and bonded to a circuit carrier 1000, such as a printed circuit board, a mother board, or the like.

In alternative embodiments, after bonding the bridge structure, forming the encapsulant and removing the temporary carrier, the exposed self-aligned structures may be removed or further mounted with other components or devices, depending on the product requirements. Because possible shifts during the placement of the individual semiconductor dies have been lessened or corrected through the formation of the self-aligned structures, better alignment of the bridge structure with the semiconductor dies is still achieved even subsequently removing the self-aligned structure from the packages.

Figure 4A:
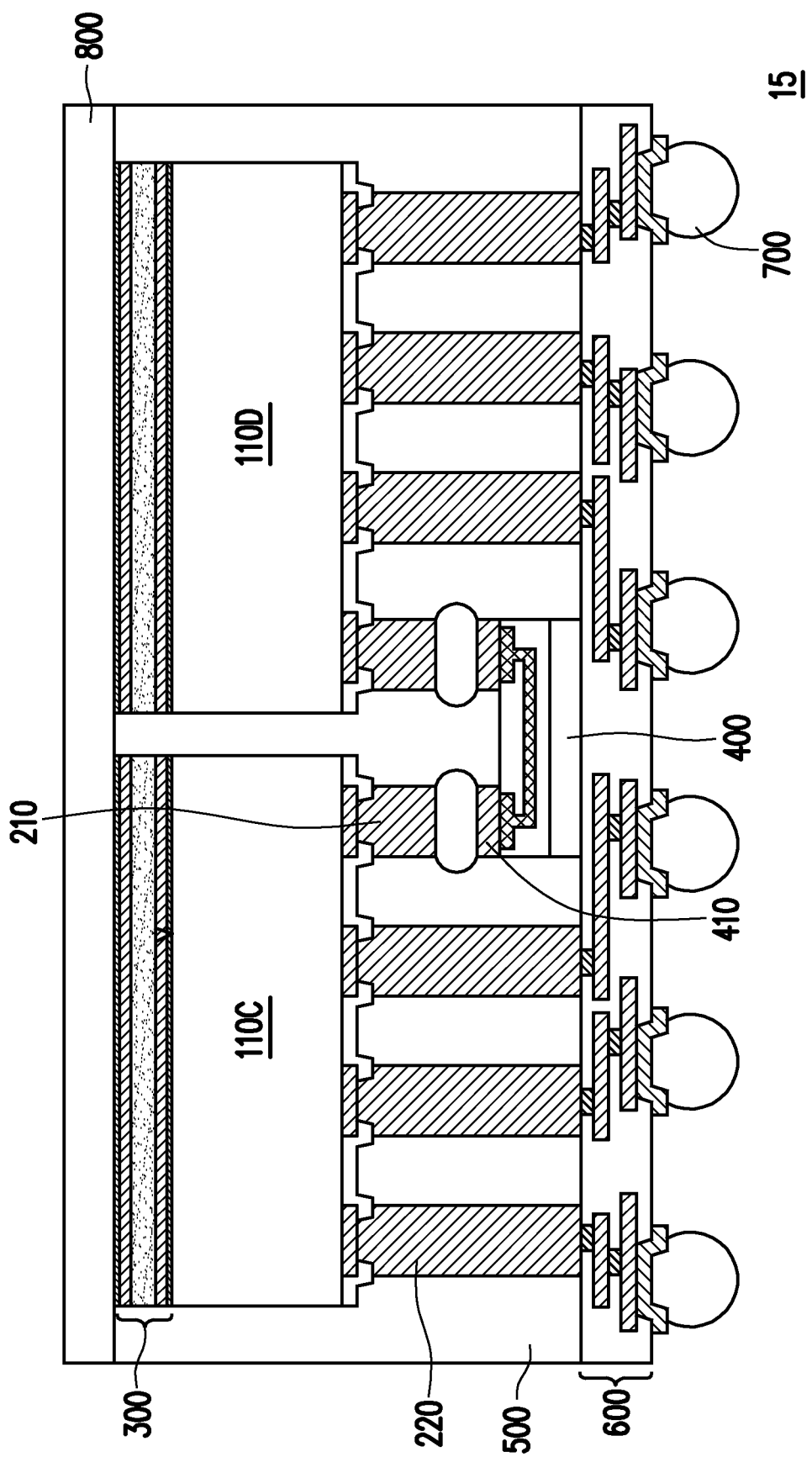
FIG. 4A through FIG. 4B are schematic cross-sectional views illustrating semiconductor packages according to some embodiments of the present disclosure.

In FIG. 4A is shown a schematic cross-sectional view of a semiconductor package 15 according to some embodiments of the present disclosure. The semiconductor package 15 of FIG. 4A may contain similar components to the semiconductor package 10 of FIG. 1R, and the same or similar reference numerals are used to indicate analogous components between the two packages 10 and 15. The semiconductor package 15 differs from the semiconductor package 10 as including a heat spreading module 800 connected to the self-aligned structures 300 and the encapsulant 500. In some embodiments, the heat spreading module 800 is attached to the self-aligned structures 300 and the encapsulant 500 by a thermal interface material layer (not shown), an adhesive (not shown), or a combination thereof. In some embodiments, the heat spreading module 800 consists of a block of thermally conductive material that promotes dissipation of the heat produced while operating the semiconductor dies 110C, 110D. In some embodiments, the heat spreading module 800 is a laminated structure comprising a plurality of different metallic or thermally conductive layers.

Figure 4B:
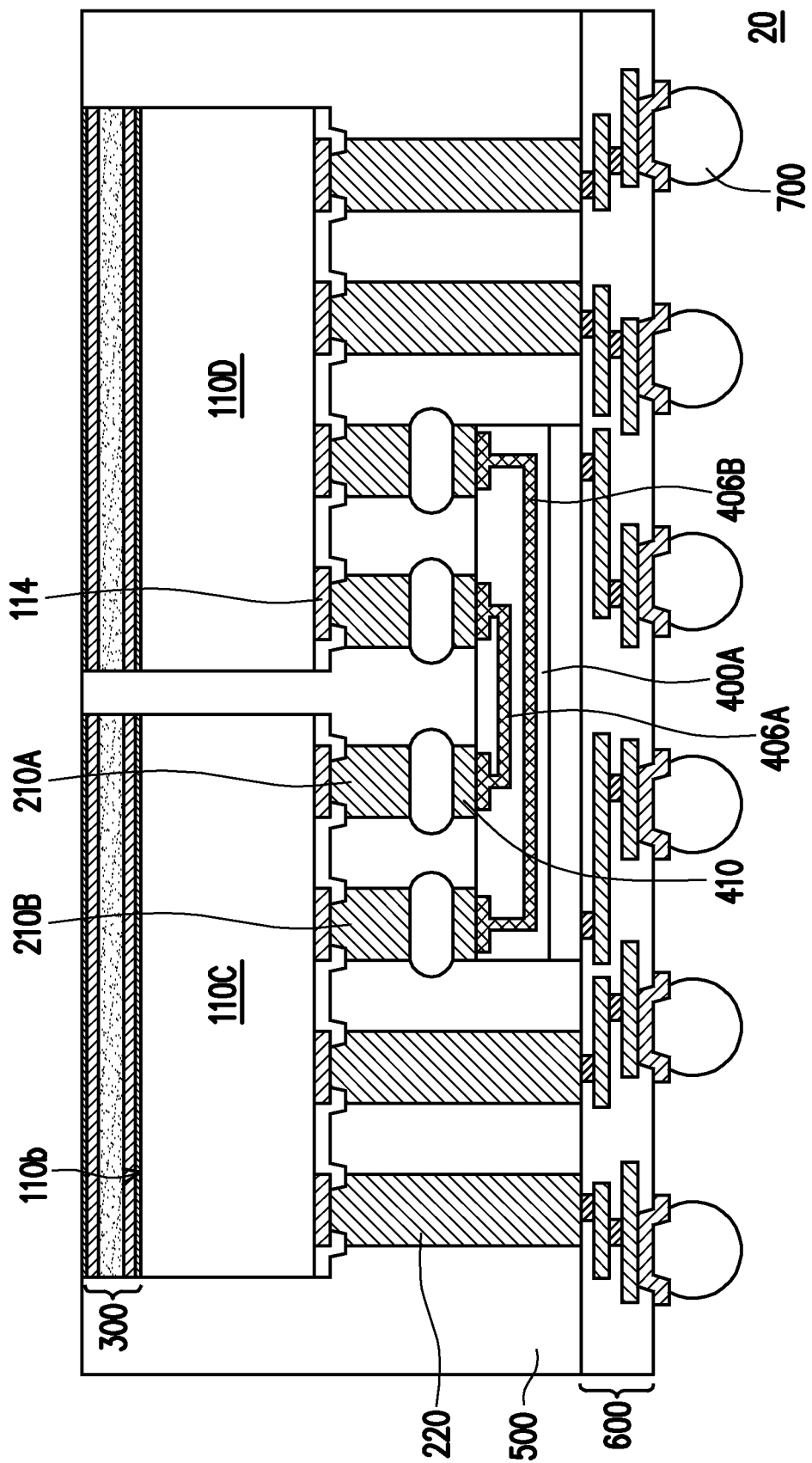

In FIG. 4B is shown a schematic cross-sectional view of a semiconductor package 20 according to some embodiments of the present disclosure. The semiconductor package 20 is similar to the semiconductor package 10, and the same or similar parts have been indicated with the same or similar reference numbers in the two packages. As shown in FIG. 4B, in some embodiments, the semiconductor package 20 includes the first conductive vias 210 formed also on the conductive pads 114 further away from the periphery of the die. As such, the bridge structure 400 in the semiconductor package 20 includes nested conductive patterns 406A, 408B to reach on both the peripheral first conductive vias 210A, and the non-peripheral first conductive vias 210B. That is, the bridge structure 400 not only connects the most adjacent first conductive vias 210A but also connects other first conductive vias 210B located farther away from the gap between the two adjacent dies 110C, 110D.

Figure 5A:
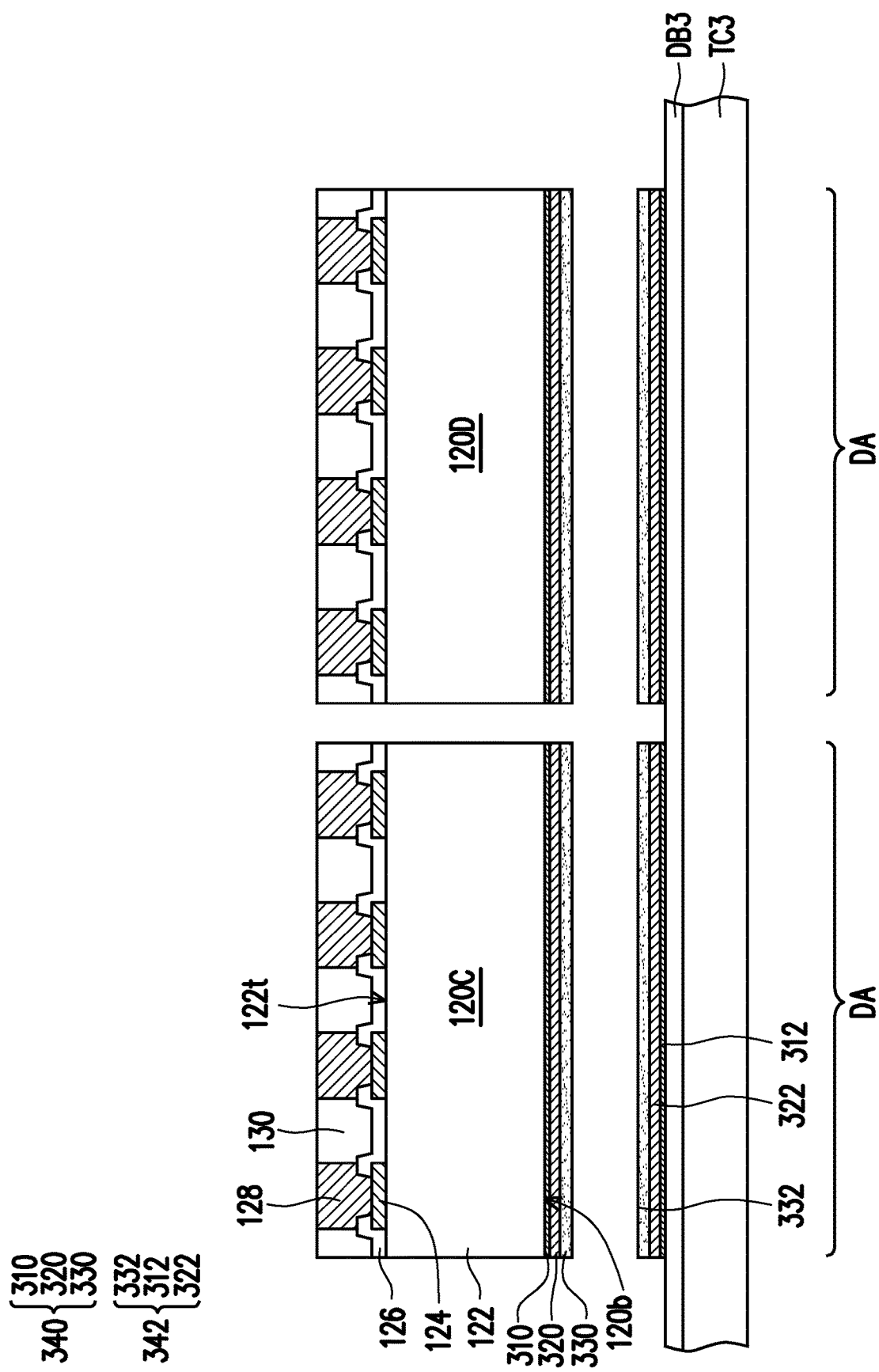
FIG. 5A through FIG. 5G are schematic cross-sectional views illustrating structures produced at various stages of a manufacturing method of a semiconductor package according to some embodiments of the present disclosure.
Figure 5B:
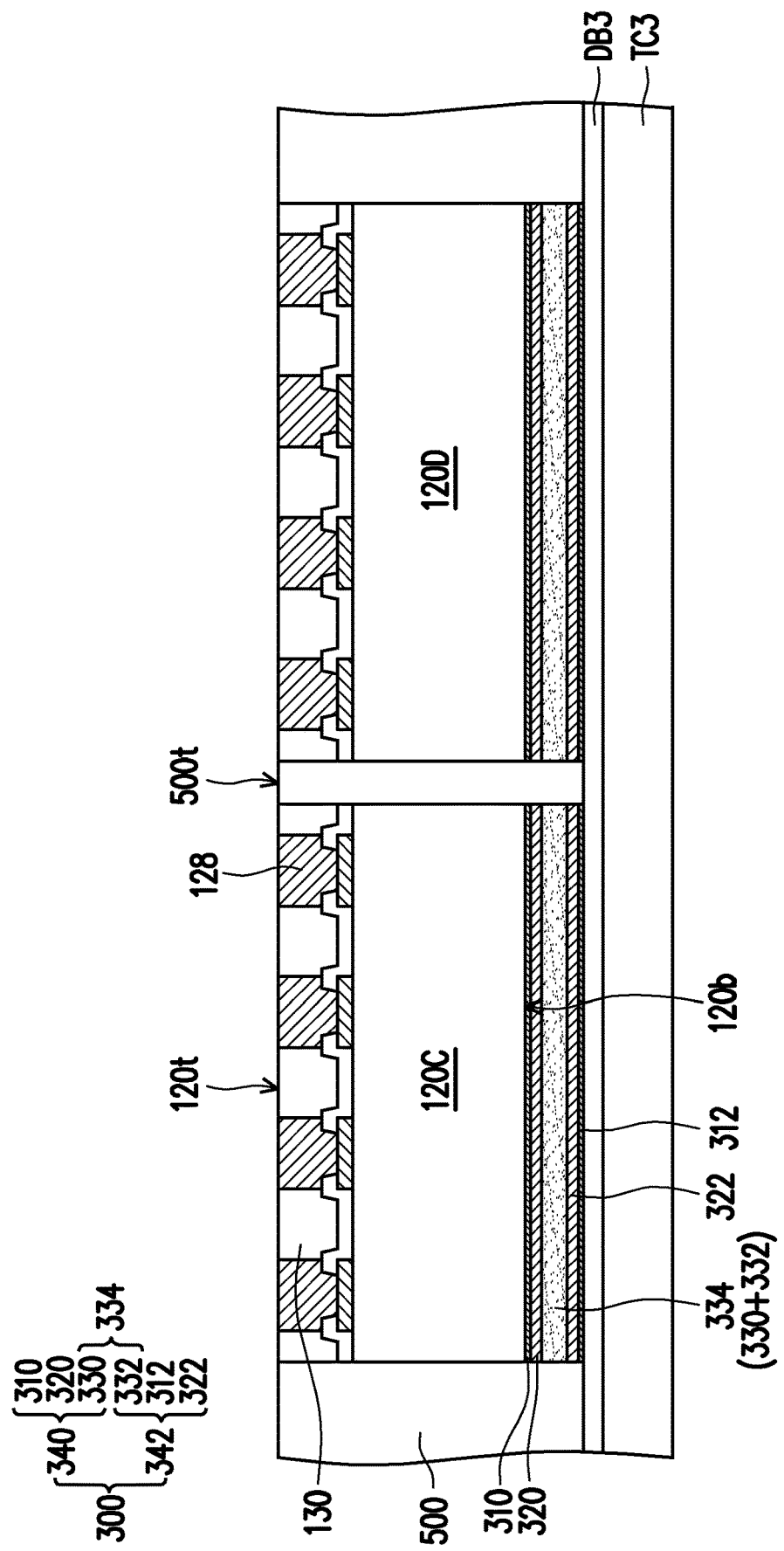
Figure 5C:
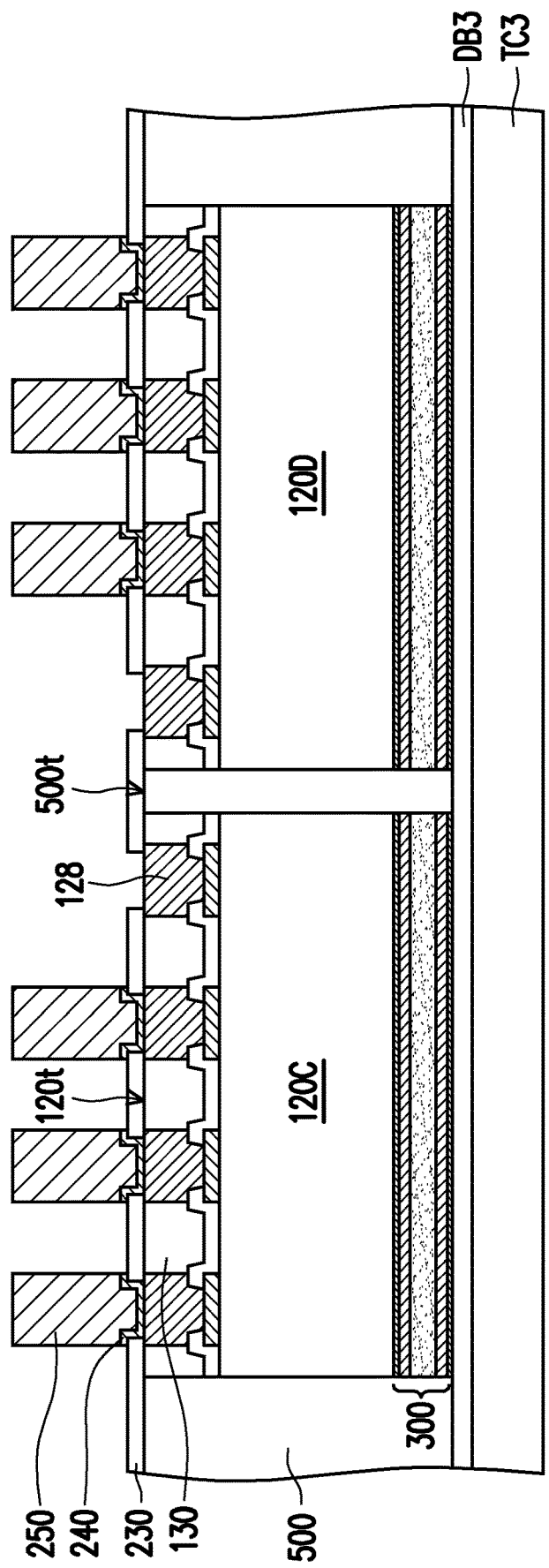
Figure 5D:
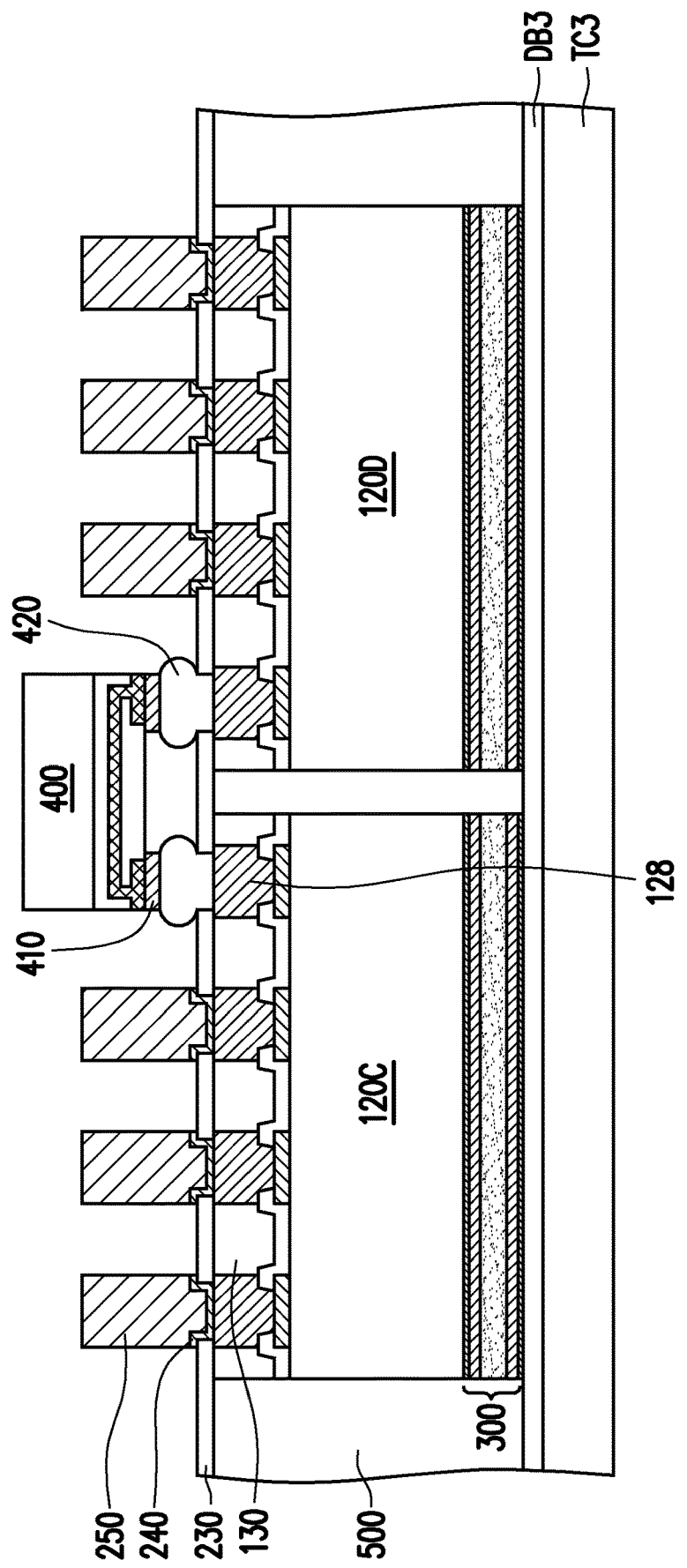
Figure 5E:
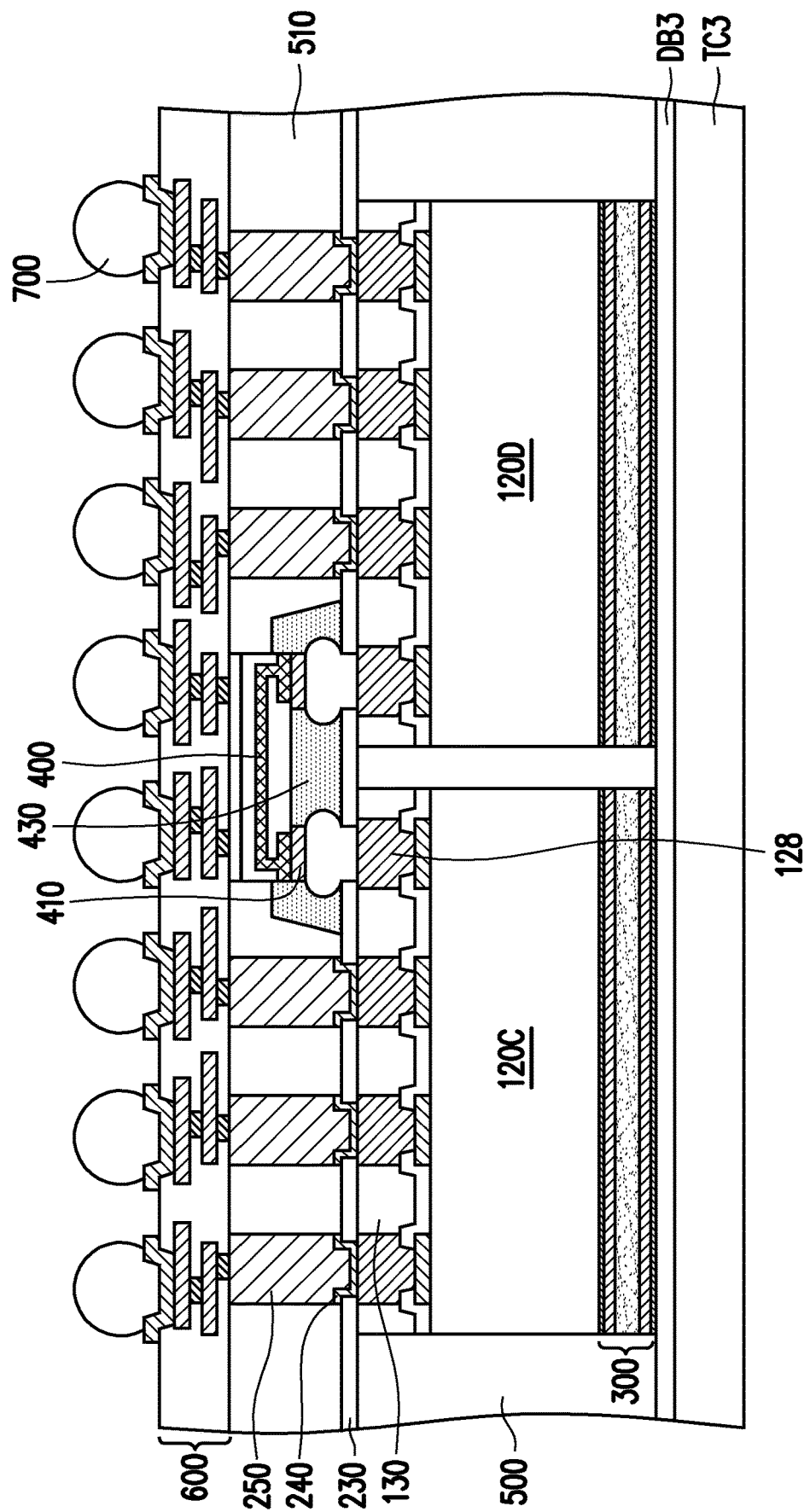
Figure 5F:
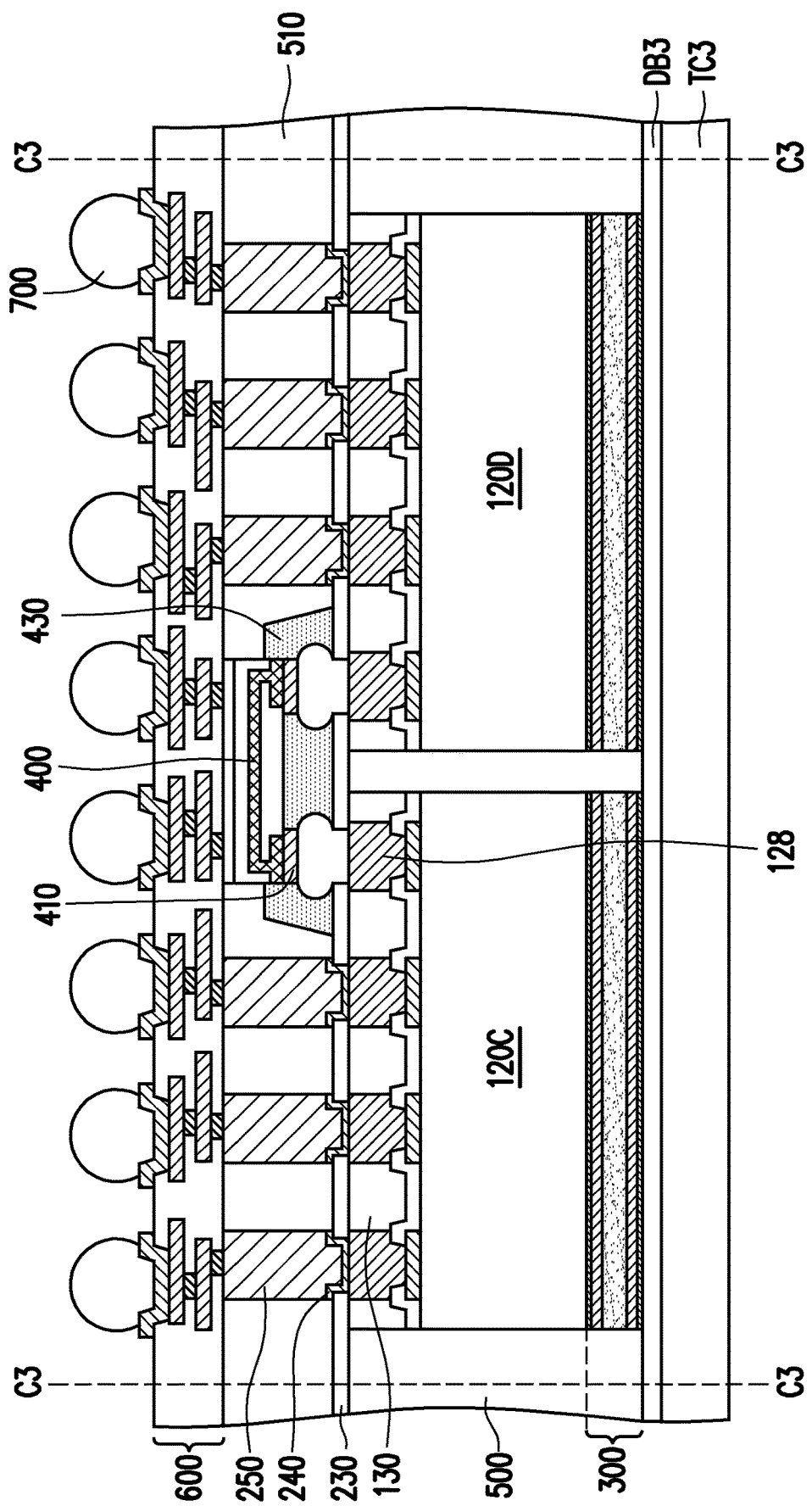
Figure 5G:
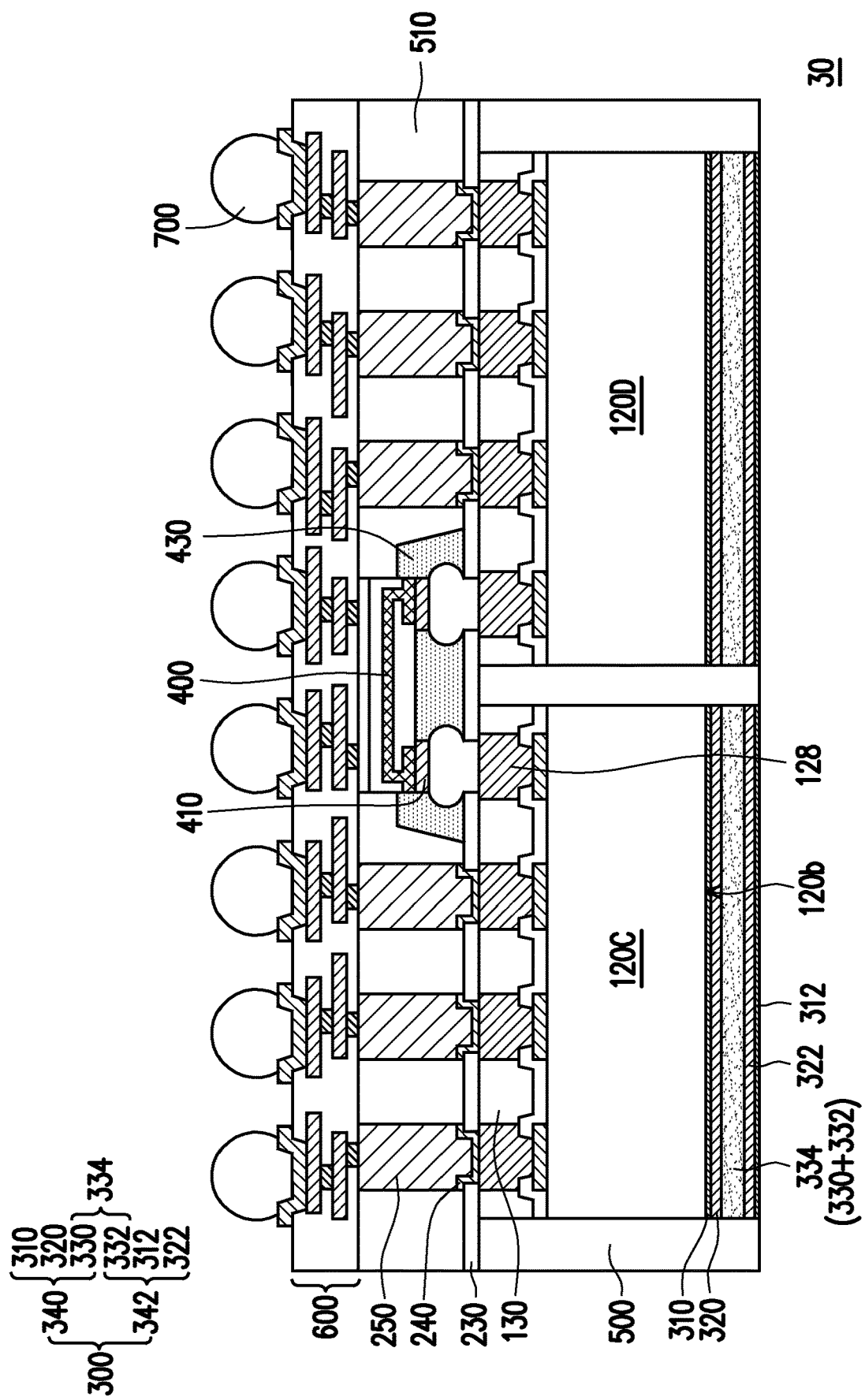

FIG. 5A through FIG. 5G are schematic cross-sectional views illustrating structures produced at various stages of a manufacturing method of a semiconductor package 30 shown in FIG. 5G.

In FIG. 5A is shown a cross-sectional view of a manufacturing intermediate produced following similar steps as previously discussed with reference to FIGS. 1B-1L. Briefly, two semiconductor dies 120C, 120D are provided. Each semiconductor dies 120C or 120D includes a semiconductor substrate 122 having a plurality of conductive pads 124 formed on a top surface 122t of the semiconductor substrate 122, a passivation layer 126 covering the top surface 122t and having a plurality of openings that exposes at least a portion of each conductive pad 124, a plurality of conductive posts 128 filling the openings of the passivation layer 126, and a protective layer 130 surrounding the conductive posts 128. On a rear surface 120b of each semiconductor die 120C or 120D is formed a first stacked layer 340 including a first seed layer 310, a first metal layer 320 and a first alloy layer 330. The two semiconductor dies 120C, 120D are placed on the die attach regions DA of a temporary carrier TC3 bearing a de-bonding layer DB3 and having a second stacked layers 342 formed on each die attach region DA. The second stacked layer 342 includes a second seed layer 312, a second metal layer 322, and a second alloy layer 332. As described with reference to FIG. 1K, the two semiconductor dies 120C, 120D may be disposed on the temporary carrier TC3 via a pick and place process.

Referring to FIG. 5B, a self-aligned structure 300 is formed on the rear surface 120b of each die 120C or 120D by soldering together the first alloy layer 330 and the second alloy layer 332 to form a joint alloy layer 334. The formation of the self-aligned structure 300 may correct for shifts in the original placement positions of the two semiconductor dies 120C, 120D with respect to the die attach locations DA. After the self-aligned structures 300 are formed, the two semiconductor dies 120C, 120D and the self-aligned structures 300 are encapsulated in an encapsulant 500. The encapsulant 500 may be formed by a sequence of overmolding and grinding, as described above with reference to FIG. 1N and FIG. 1O. A top surface 500t of the encapsulant 500 may expose a top surface 120t of each semiconductor die 120C or 120D. The top surface 120t may be defined by the top surfaces of the conductive posts 128 and the top surface of the protective layer 130. In some embodiments, during the grinding step performed to form the encapsulant 500, upper portions of the conductive posts 128 and the protective layer 130 may also be removed.

Referring to FIG. 5C, after forming the encapsulant 500, a patterned protective layer 230 is formed on the top surface 500t of the encapsulant 500 and the top surfaces 120t of the semiconductor dies 120C, 120D. The patterned protective layer 230 may expose at least a portion of the conductive posts 128 of each die 120C or 120D. In some embodiments, a material of the patterned protective layer 230 includes polyimide, epoxy resin, acrylic resin, phenol resin, benzocyclobutene (BCB), polybenzoxazole (PBO), or any other suitable polymer-based dielectric material. The patterned protective layer 230 may be formed by suitable fabrication techniques such as spin-on coating, chemical vapor deposition (CVD), plasma-enhanced chemical vapor deposition (PECVD), or the like. In some embodiments, the pattern of the patterned dielectric layer 230 may be produced during an etching step.

In some embodiments, as shown in FIG. 5C, a plurality of conductive through vias 250 is formed on at least some of the conductive posts 128 of each die 120C or 120D. In some embodiments, the conductive through vias 250 include through interlayer vias (TIVs). A material of the conductive through vias 250 may contain copper, copper alloys, or the like. A third seed layer 240 may be disposed between the conductive through vias 250 and the conductive posts 128. A portion of the seed layer 240 may further extend between the conductive through vias 250 and an underlying portion of the patterned protective layer 230. Formation of the conductive through vias 250 may involve the following steps. First a blanket third seed material layer (not shown) is deposited, covering the entire patterned protective layer 230. A patterned mask (not shown) is then produced, for example through a sequence of deposition, photolithography, and etching. The patterned mask (not shown) exposes through a plurality of openings (not shown) portions of the third seed material layer overlying the conductive bumps 128. Filling of the openings of the patterned mask with a conductive material (not shown) and subsequent removal of the patterned mask and the underlying portions of the third seed material layer produces the third seed layer 240 and the conductive through vias 250. In some embodiments, at least one conductive post 128 for each semiconductor die 120C or 120D is covered by the patterned mask (not shown), so that a conductive through via 250 is not formed thereon. Upon removal of the patterned mask (not shown), the conductive posts 128 on which no conductive through vias 250 were formed are again exposed by the openings of the patterned protective layer 230.

Referring to FIG. 5D, in a subsequent step of the process a bridge structure 400 is bonded to the exposed conductive posts 128, similarly to what described above with reference to FIG. 1M. In some embodiments, the bridge structure 400 is electrically connected to the conductive posts 128 of each die 120C or 120D through a plurality of conductors 410. In some embodiments, because shifts in the placement position of each semiconductor die 120C or 120D were at least partially corrected during formation of the self-aligned structures 300, a degree of alignment of the bridge structure 400 with the semiconductor dies 120C, 120D is increased, and a more reliable connection is established.

Referring to FIG. 5E, an underfill 430 may be optionally produced between the bridge structure 400 and the patterned protective layer 230 to protect the connectors 410. The conductive through vias 250 and the bridge structure 400 are then encapsulated in a second encapsulant 510 formed over the patterned protective layer 230. The second encapsulant 510 may be formed following similar processes and using similar materials as described for the encapsulant 500, and a detailed description thereof is omitted herein. If a grinding process is performed, a portion of the bridge structure 400 and a portion of each conductive through via 250 may also be removed. A redistribution structure 600 is further formed on top of the second encapsulant 510, the conductive through vias 250 and the bridge structure 400. The redistribution structure 600 is electrically connected to each semiconductor die 120C or 120D through the conductive through vias 250. The redistribution structure 600 is further connected to the bridge structure 400 through the semiconductor dies 120C and 120D. A plurality of connective terminals 700 is connected to the redistribution structure, and may be used to integrate the produced semiconductor package into larger devices (not shown).

Referring to FIG. 5F, a singulation step is performed by dicing along the cut lines C3-C3 (shown in FIG. 5F), similarly to the steps described above with reference to FIG. 1P, and the temporary carrier TC3 and the de-bonding layer DB3 are detached from the package array.

Based on the above, a semiconductor package 30 shown in FIG. 5G includes the first semiconductor die 120C and the second semiconductor die 120D interconnected through the bridge structure 400. The conductive through vias 250 establishes electrical connection between the semiconductor dies 120C, 120D and the redistribution structure 600. In some embodiments, the self-aligned structures 300 are built on the rear surfaces 120b of each die 120C or 120D. Each self-aligned structure 300 is formed by joining together a first stacked layer 340 formed on a rear surface 120b of each semiconductor die 120C or 120D, with a second stacked layer 342. In some embodiments, the stacked layer 340 includes a seed layer 310, a metal layer 320 and an alloy layer 330, while the stacked layer 342 includes a seed layer 312, a metal layer 322 and an alloy layer 332. In certain embodiments, the self-aligned structure 300 is formed by soldering the two alloy layers 330, 332 into a joint alloy layer 334. The first semiconductor die 120C, the second semiconductor die 120D and the self-aligned structures 300 are encapsulated by the encapsulant 500. The patterned protective layer 230 is formed over the encapsulant 500. The second encapsulant 510 is disposed over the dielectric layer 230 and encapsulates the bridge structure 400 and the conductive through vias 250. The redistribution structure 600 is electrically connected to the conductive through vias 250 and to the connective terminals 700.

Figure 6:
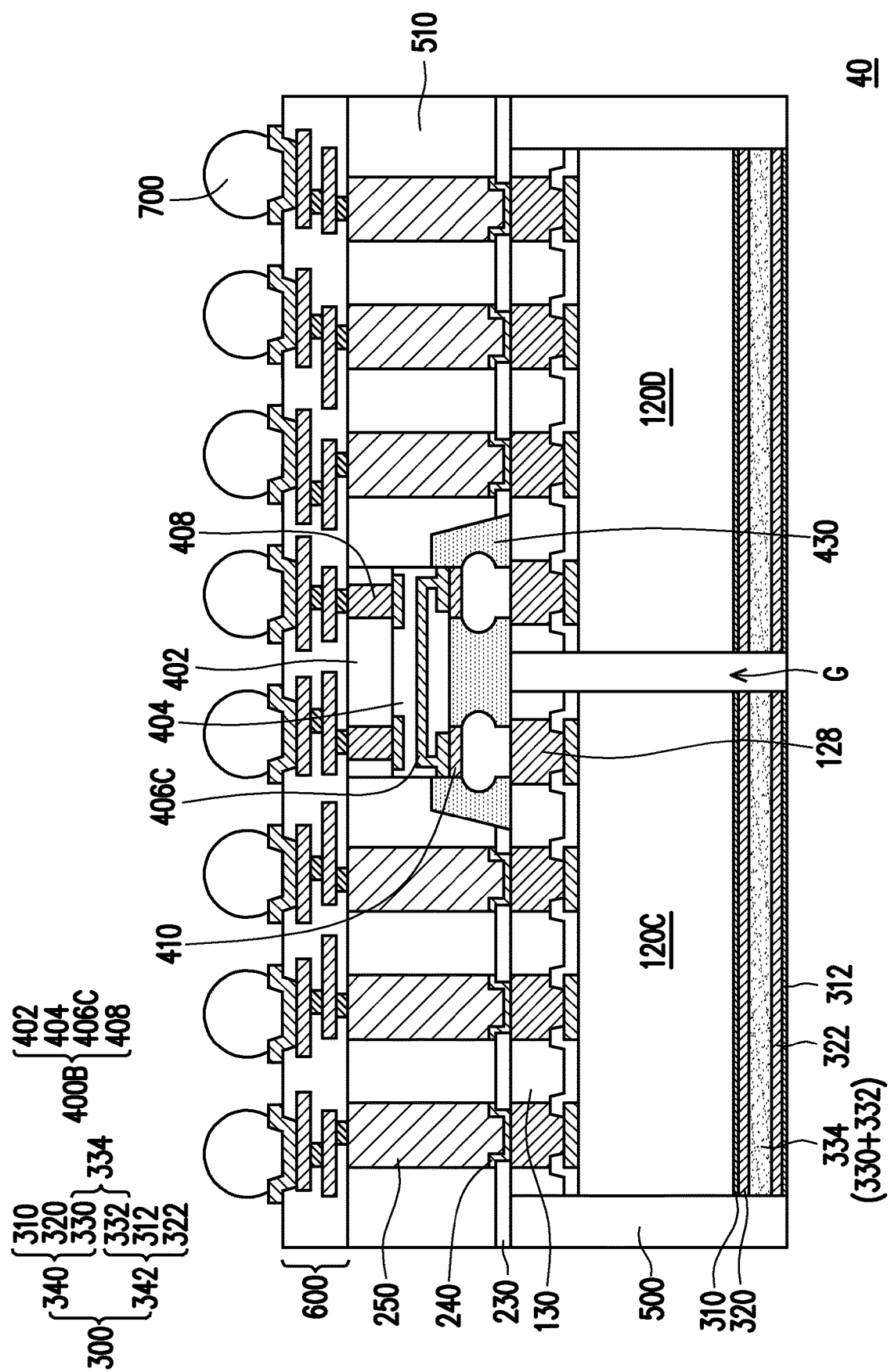
FIG. 6 is a schematic cross-sectional view illustrating a semiconductor package according to some embodiments of the present disclosure.

In FIG. 6 is shown a schematic cross-sectional view of a semiconductor package 40 according to some embodiments of the present disclosure. The semiconductor package 40 of FIG. 6 may contain similar components to the semiconductor package 30 of FIG. 5G, and the same or similar reference numerals are used to indicate analogous elements or components. The semiconductor package 40 differs from the semiconductor package 30 as a bridge structure 400B interconnecting the semiconductor dies 120C, 120D comprises at least one through interconnection via 408 formed in the semiconductor substrate 402. In other words, the bridge structure 400B provides horizontal integration between the two semiconductor dies 120C, 120D, and also vertical electrical connection between the semiconductor dies 120C, 120D and the redistribution structure 600. As shown in FIG. 6, at least some of the interconnecting vias 606 of the redistribution structure are connected to the through interconnection vias 408 formed in the bridge structure 400B. To achieve vertical electrical connection, the conductive pattern 406C embedded in the dielectric layer 404 of the bridge structure 400B extend through an entire thickness direction of the dielectric layer 404, contacting the connectors 410 and the through interconnection vias 408.

In some embodiments, as shown in FIG. 6, the protective layer 230 may cover only partially the semiconductor dies 120C, 120D and not extend over the portion of the encapsulant 500 filling the gap G in between the two semiconductor dies 120C and 120D. As such, the conductive posts 128 of each semiconductor die 120C, 120D that are connected through the bridge structure 400B are exposed by the same opening of the protective layer 230. In some embodiments, the underfill 430 may fill the larger opening of the protective layer 230 and contact the semiconductor dies 120C, 120D.

In light of the present disclosure, formation of a self-aligned structure on the rear surface of the semiconductor dies after placement of the dies on a carrier ensures a closer final position of the dies to the originally intended position. In other words, placement shift possibly introduced by pick and place methods used to deposit the dies on the carrier can be at least partially corrected. As such, an alignment between the semiconductor dies and a bridge structure interconnecting the semiconductor dies is improved, ensuring a more robust electrical connection. As such, reliability of the semiconductor package is increased, and a failure rate due to alignment issues may also be reduced. In some embodiments the self-aligned structure may also help to dissipate the heat generated by the semiconductor dies during the use of the semiconductor package, or may serve as a connection between the package and a heat dissipating module.

In some embodiments of the present disclosure, a semiconductor package includes a first chip, a second chip, self-aligned structures, a bridge structure, and an insulating encapsulant. The first chip has a first active surface, a first rear surface opposite to the first active surface and a first plurality of conductive pads disposed on the first active surface. The second chip is disposed beside the first chip and has a second active surface, a second rear surface opposite to the second active surface and a second plurality of conductive pads disposed on the second active surface. The self-aligned structures are respectively disposed on the first rear surface of the first chip and the second rear surface of the second chip. The bridge structure has a semiconductor substrate. The bridge structure is electrically connected to at least one conductive pad of the first chip and at least one conductive pad of the second chip. The insulating encapsulant covers at least the side surfaces of the first and second chips, a side surface of the semiconductor substrate, and the side surfaces of the self-aligned structures.

In some embodiments of the present disclosure, a semiconductor package includes a pair of semiconductor dies, and each of the pair of semiconductor dies has conductive pads disposed on an active surface. A bridge structure is also included in the semiconductor package. The bridge structure is connected to at least one conductive pad of one of the pair of semiconductor dies and at least one conductive pad of the other of the pair of semiconductor dies. The semiconductor package further includes a multilayered structure disposed on a rear surface of each of the pair of semiconductor dies. At least one multilayered structure includes a top metal layer, a bottom metal layer, and an intermetallic layer and has a surface coplanar with a surface of the insulating encapsulant. An insulating encapsulant surrounds the bridge structure and the multilayered structures and encapsulates the pair of semiconductor dies.

In some embodiments of the present disclosure, a manufacturing method of a semiconductor package includes at least the following steps. A chip is provided. The chip has an active surface, a rear surface opposite to the active surface and conductive pads disposed on the active surface. A first solder-containing alloy layer is formed on the rear surface of the chip. A second solder-containing alloy layer is formed on a surface and at a location where the chip is to be attached. The chip is mounted to the surface and the first solder-containing alloy layer is aligned with the second solder-containing alloy layer. A reflow step is performed on the first and second solder-containing alloy layers to form a joint alloy layer between the chip and the surface.

In some embodiments of the present disclosure, a semiconductor package includes a pair of semiconductor dies, a semiconductor bridge, a first multilayered structure, a second multilayered structure, and a first encapsulant. Each semiconductor die of the pair of semiconductor dies includes a semiconductor substrate and conductive pads. The conductive pads are disposed at a front surface of the semiconductor substrate. The semiconductor bridge electrically interconnects the pair of semiconductor dies. The first multilayered structure is disposed on a rear surface of the semiconductor substrate of one semiconductor die of the pair of semiconductor dies. The second multilayered structure is disposed on a rear surface of the semiconductor substrate of the other semiconductor die of the pair of semiconductor dies. The first encapsulant laterally wraps the first multilayered structure, the second multilayered structure and the pair of semiconductor dies. Each one of the first multilayered structure and the second multilayered structure includes a top metal layer, a bottom metal layer, and an intermetallic layer. Each one of the first multilayered structure and the second multilayered structure has a surface coplanar with a surface of the first encapsulant. The top metal layers, the bottom metal layers and the intermetallic layers are in contact with the first encapsulant.

In some embodiments of the present disclosure, a semiconductor package includes a first semiconductor die, a bridge structure, a first encapsulant, a redistribution structure, a conductive via, and stacked metallic layers. The first semiconductor die includes a first semiconductor substrate and conductive pads. The conductive pads are disposed on a top surface of the first semiconductor substrate. The bridge structure is stacked over the first semiconductor die and is electrically connected to a first conductive pad of the conductive pads of the first semiconductor die. The first encapsulant encapsulates the bridge structure. The redistribution structure is disposed on the bridge structure and the first encapsulant. The redistribution structure includes dielectric layers and conductive layers alternately stacked. The conductive via is disposed on a side of the bridge structure and extends through the first encapsulant to electrically connect the redistribution structure to a second conductive pad of the conductive pads of the first semiconductor die. The stacked metallic layers are disposed in direct contact with a bottom surface of the first semiconductor substrate. The stacked metallic layers include a first seed layer, a first metal layer, and a joint alloy layer stacked, in order, on the bottom surface of the first semiconductor substrate.

In some embodiments of the present disclosure, a semiconductor package includes a first semiconductor die, a second semiconductor die, a semiconductor bridge, a first multilayered structure, a second multilayered structure, and an encapsulant. The first semiconductor die includes first conductive posts exposed at an active surface of the first semiconductor die. The second semiconductor die is disposed beside the first semiconductor die and includes second conductive posts exposed at an active surface of the second semiconductor die. The semiconductor bridge includes a semiconductor substrate, a dielectric layer, and a conductive pattern. The dielectric layer is disposed on the semiconductor substrate. The conductive pattern extends through the dielectric layer and interconnects one first conductive post of the first conductive posts to one second conductive post of the second conductive posts. The first multilayered structure is disposed on a rear surface of the first semiconductor die and includes a first joint alloy layer disposed in between a first pair of metal layers. The second multilayered structure is disposed on a rear surface of the second semiconductor die and includes a second joint alloy layer disposed in between a second pair of metal layers. The encapsulant is disposed around the first semiconductor die, the second semiconductor die, the first multilayered structure, and the second multilayered structure. A portion of the encapsulant fills a gap between the first semiconductor die and the second semiconductor die and further separates the first multilayered structure from the second multilayered structure.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor package, comprising:
a pair of semiconductor dies, each semiconductor die of the pair of semiconductor dies comprising a semiconductor substrate and conductive pads disposed at a front surface of the semiconductor substrate;
a semiconductor bridge, electrically interconnecting the pair of semiconductor dies;
a first multilayered structure disposed on a rear surface of the semiconductor substrate of one semiconductor die of the pair of semiconductor dies;
a second multilayered structure disposed on a rear surface of the semiconductor substrate of the other semiconductor die of the pair of semiconductor dies; and
a first encapsulant, laterally wrapping the first multilayered structure, the second multilayered structure, and the pair of semiconductor dies,
wherein each one of the first multilayered structure and the second multilayered structure includes a top metal layer, a bottom metal layer, and an intermetallic layer, and has a surface coplanar with a surface of the first encapsulant, and
wherein the top metal layer, the bottom metal layer and the intermetallic layer of the first multilayered structure are overlapped with a first portion of the semiconductor bridge along a first direction, and the top metal layer, the bottom metal layer and the intermetallic layer of the second multilayered structure are overlapped with a second portion of the semiconductor bridge along the first direction, and wherein the first portion and the second portion of the semiconductor bridge are separated by a third portion of the semiconductor bridge that is non-overlapped with the first multilayered structure and the second multilayered structure along the first direction, and
the top metal layers, the bottom metal layers, and the intermetallic layers of the first multilayered structure and the second multilayered structure are in contact with the first encapsulant.

2. The semiconductor package of claim 1, further comprising a second encapsulant disposed over the first encapsulant and the pair of semiconductor dies, wherein the second encapsulant laterally wraps the semiconductor bridge.

3. The semiconductor package of claim 2, further comprising a patterned protective layer disposed between the first encapsulant and the second encapsulant, wherein the semiconductor dies of the pair of semiconductor dies further comprise conductive posts disposed on the conductive pads, and the patterned protective layer includes openings exposing the conductive posts of the pair of semiconductor dies.

4. The semiconductor package of claim 3, further comprising conductive vias extending through the second encapsulant beside the semiconductor bridge, wherein the conductive vias contact the conductive posts of the pair of semiconductor dies through the openings of the patterned protective layer.

5. The semiconductor package of claim 4, further comprising seed layers disposed between the conductive posts and the conductive vias within the openings of the patterned protective layer.

6. The semiconductor package of claim 3, wherein the semiconductor bridge comprises a first conductive bump connected to the one semiconductor die of the pair, and a second conductive bump connected to the other semiconductor die of the pair.

7. The semiconductor package of claim 6, wherein the first conductive bump and the second conductive bump contact the pair of semiconductor dies through a same opening of the patterned protective layer.

8. A semiconductor package, comprising:
a first semiconductor die, comprising a first semiconductor substrate and conductive pads disposed on a top surface of the first semiconductor substrate;
a bridge structure, stacked over the first semiconductor die and electrically connected to a first conductive pad of the conductive pads of the first semiconductor die;
a first encapsulant, encapsulating the bridge structure;
a redistribution structure, disposed on the bridge structure and the first encapsulant, the redistribution structure comprising dielectric layers and conductive layers alternately stacked;
a conductive via, disposed on a side of the bridge structure and extending through the first encapsulant to electrically connect the redistribution structure to a second conductive pad of the conductive pads of the first semiconductor die; and
stacked metallic layers disposed in direct contact with a bottom surface of the first semiconductor substrate, wherein the stacked metallic layers comprise a first seed layer, a first metal layer, and a joint alloy layer stacked, in order, on the bottom surface of the first semiconductor substrate.

9. The semiconductor package of claim 8, further comprising a second semiconductor die disposed beside the first semiconductor die,
wherein the second semiconductor die comprises a second semiconductor substrate and conductive pads disposed on a top surface of the second semiconductor substrate,
the bridge structure partially overlaps with the first semiconductor die and the second semiconductor die, and
the bridge structure is further electrically connected to a third conductive pad of the conductive pads of the second semiconductor die.

10. The semiconductor package of claim 9, wherein the bridge structure comprises:
a third semiconductor substrate;
a dielectric layer disposed on a bottom surface of the third semiconductor substrate; and
a conductive pattern extending through the dielectric layer,
wherein the conductive pattern electrically connects the first conductive pad of the first semiconductor die to the third conductive pad of the second semiconductor die.

11. The semiconductor package of claim 10, wherein the bridge structure further comprises conductive through vias extending through the third semiconductor substrate and electrically connected to the redistribution structure.

12. The semiconductor package of claim 9, wherein another conductive via electrically connects the second semiconductor die to the redistribution structure.

13. The semiconductor package of claim 8, wherein the stacked metallic layers further comprise a second metal layer stacked on the joint alloy layer at a side of the joint alloy layer opposite with respect to the first metal layer.

14. The semiconductor package of claim 13, wherein the stacked metallic layers further comprise a second seed layer stacked on the second metal layer at a side of the second metal layer opposite with respect to the joint alloy layer.

15. The semiconductor package of claim 8, further comprising:
a second encapsulant, encapsulating the first semiconductor die and the stacked metallic layers, and
a dielectric layer, disposed between the first encapsulant and the second encapsulant.

16. A semiconductor package, comprising:
a first semiconductor die, comprising first conductive posts exposed at an active surface of the first semiconductor die;
a second semiconductor die, disposed beside the first semiconductor die and comprising second conductive posts exposed at an active surface of the second semiconductor die;
a semiconductor bridge, comprising a semiconductor substrate, a dielectric layer disposed on the semiconductor substrate, and a conductive pattern extending through the dielectric layer and interconnecting one first conductive post of the first conductive posts to one second conductive post of the second conductive posts;
a first multilayered structure, disposed on a rear surface of the first semiconductor die and comprising a first joint alloy layer disposed in between a first pair of metal layers;
a second multilayered structure, disposed on a rear surface of the second semiconductor die and comprising a second joint alloy layer disposed in between a second pair of metal layers; and
an encapsulant, disposed around the first semiconductor die, the second semiconductor die, the first multilayered structure, and the second multilayered structure, wherein a portion of the encapsulant fills a gap between the first semiconductor die and the second semiconductor die and further separates the first multilayered structure from the second multilayered structure.

17. The semiconductor package of claim 16, further comprising a third multilayered structure, disposed on the rear surface of the first semiconductor die and comprising a third joint alloy layer disposed in between a third pair of metal layers, wherein the encapsulant further separates the first multilayered structure from the third multilayered structure.

18. The semiconductor package of claim 16, wherein an underfill is disposed between the semiconductor bridge and the portion of encapsulant filling the gap between the first semiconductor die and the second semiconductor die.

19. The semiconductor package of claim 18, wherein a patterned protective layer is disposed between the underfill and the portion of encapsulant filling the gap between the first semiconductor die and the second semiconductor die.

20. The semiconductor package of claim 16, wherein the second multilayered structure fully covers the rear surface of the second semiconductor die.

* * * * *